US009514269B1

(12) United States Patent
Bonawitz et al.

(10) Patent No.: US 9,514,269 B1
(45) Date of Patent: Dec. 6, 2016

(54) DETERMINING EXPECTED FAILURE MODES OF BALLOONS WITHIN A BALLOON NETWORK

(71) Applicant: X Development LLC, Mountain View, CA (US)

(72) Inventors: Keith Bonawitz, Mountain View, CA (US); Joshua Weaver, Mountain View, CA (US); Richard DeVaul, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 630 days.

(21) Appl. No.: 13/943,935

(22) Filed: Jul. 17, 2013

(51) Int. Cl.
*G06G 7/48* (2006.01)
*G06F 17/50* (2006.01)

(52) U.S. Cl.
CPC .................. *G06F 17/509* (2013.01)

(58) Field of Classification Search
CPC ...................................... G06F 17/509
USPC ................................................ 703/6
See application file for complete search history.

(56) References Cited

U.S. PATENT DOCUMENTS

| | | | | |
|---|---|---|---|---|
| 4,865,266 A | * | 9/1989 | George | B64B 1/40 244/31 |
| 5,813,634 A | * | 9/1998 | Pizzicaroli | B64G 1/1085 244/158.4 |
| 6,151,308 A | * | 11/2000 | Ibanez-Meier | H04B 7/18508 370/316 |
| 6,167,263 A | | 12/2000 | Campbell | |
| 6,269,242 B1 | * | 7/2001 | Leopold | H04B 7/2041 455/12.1 |
| 7,777,674 B1 | * | 8/2010 | Haddadin | H01Q 1/28 342/368 |
| 7,801,522 B2 | | 9/2010 | Knoblach et al. | |
| 7,859,653 B2 | * | 12/2010 | Ragucci | G01B 11/168 356/33 |
| 7,913,948 B2 | | 3/2011 | Porter | |
| 2002/0077800 A1 | * | 6/2002 | Kampe | G06F 11/008 703/21 |

(Continued)

OTHER PUBLICATIONS

G. Wu, R. Miura, and Y. Hase, "A Broadband Wireless Access System Using Stratospheric Platforms," Proc. Global Telecommunications Conf. 2000 (Globecom '00), vol. 1, Nov. 27-Dec. 1, San Francisco, USA, pp. 225-223.*

(Continued)

*Primary Examiner* — Omar Fernandez Rivas
*Assistant Examiner* — Iftekhar Khan
(74) *Attorney, Agent, or Firm* — McDonnell Boehnen Hulbert & Berghoff LLP

(57) ABSTRACT

Example methods and systems for determining failure modes of balloons within a balloon network are described. One example method includes: (a) determining at least one cohort balloon of a first balloon, where the first balloon is operating as part of a balloon network and where each cohort balloon shares at least one property with the first balloon, (b) determining at least one expected failure mode based at least in part on at least one failure of at least one cohort balloon, (c) determining a predicted failure mode of the first balloon based at least in part on the at least one expected failure mode, and (d) causing the first balloon to operate within the balloon network based at least in part on the predicted failure mode of the first balloon.

29 Claims, 11 Drawing Sheets

(56) References Cited

U.S. PATENT DOCUMENTS

| | | | |
|---|---|---|---|
| 2002/0167702 A1 | 11/2002 | Badesha et al. | |
| 2003/0095064 A1* | 5/2003 | Branscombe | H04B 7/2041 342/354 |
| 2005/0014499 A1* | 1/2005 | Knoblach | B64B 1/40 455/431 |
| 2006/0063529 A1* | 3/2006 | Seligsohn | B64B 1/44 455/431 |
| 2006/0074558 A1* | 4/2006 | Williamson | G01C 21/165 701/469 |
| 2013/0010610 A1* | 1/2013 | Karthikeyan | H04L 12/2423 370/242 |
| 2013/0177321 A1* | 7/2013 | DeVaul | H04B 10/1129 398/115 |

OTHER PUBLICATIONS

Karapantazis et al. ("Broadband Communications Via High-Altitude Platform", 2005, IEEE, pp. 1-31).*
Fidler et al.("Optical Communications for High-Altitude Platforms", 2010, IEEE, pp. 1058-1070).*
Charles W. Vogt, Jr., Performance Capability of a Damaged Lighter—Than—Air Vehicle Operating in the Near Space Regime, AFIT/GSS/ENY/06-M13, Mar. 2006.
Khare et al., "On Recovery of Lost Targets in a Cluster-based Wireless Sensor Network," In Proceedings of PerCom Workshops, IEEE, Mar. 25, 2011, pp. 20-213.
International Search Report and Written Opinion for PCT/US2014/052140 mailed Dec. 1, 2014, 10 pages.

\* cited by examiner

DETERMINING EXPECTED FAILURE MODES OF BALLOONS WITHIN A BALLOON NETWORK

BACKGROUND

Unless otherwise indicated herein, the materials described in this section are not prior art to the claims in this application and are not admitted to be prior art by inclusion in this section.

Computing devices such as personal computers, laptop computers, tablet computers, cellular phones, and countless types of Internet-capable devices are increasingly prevalent in numerous aspects of modern life. As such, the demand for data connectivity via the Internet, cellular data networks, and other such networks, is growing. However, there are many areas of the world where data connectivity is still unavailable, or if available, is unreliable and/or costly. Accordingly, additional network infrastructure is desirable.

SUMMARY

Methods and systems are provided to determine predicted failure modes of balloons within a balloon network. Cohort balloons sharing at least one property with a particular balloon may first be determined. Expected failure modes may be determined based on failures of one or more of the cohort balloons. The expected failure modes may be used to determine a predicted failure mode for the particular balloon. The particular balloon may then be caused to operate within the balloon network based at least in part on the predicted failure mode.

In one example, a method is provided that includes: (a) determining at least one cohort balloon of a first balloon, where the first balloon is operating as part of a balloon network and where each cohort balloon shares at least one property with the first balloon, (b) determining at least one expected failure mode based at least in part on at least one failure of at least one cohort balloon, (c) determining a predicted failure mode of the first balloon based at least in part on the at least one expected failure mode, and (d) causing the first balloon to operate within the balloon network based at least in part on the predicted failure mode of the first balloon.

In another example, a computer readable storage medium having stored therein instructions, that when executed by a computing device, cause the computing device to perform functions is provided. The functions include: (a) determining at least one cohort balloon of a first balloon, where the first balloon is operating as part of a balloon network and where each cohort balloon shares at least one property with the first balloon, (b) determining at least one expected failure mode based at least in part on at least one failure of at least one cohort balloon, (c) determining a predicted failure mode of the first balloon based at least in part on the at least one expected failure mode, and (d) causing the first balloon to operate within the balloon network based at least in part on the predicted failure mode of the first balloon.

In still another example, a system is provided that comprises at least one processor, and data storage comprising program instructions executable by the at least one processor to cause the at least one processor to perform functions. The functions include: (a) determining at least one cohort balloon of a first balloon, where the first balloon is operating as part of a balloon network and where each cohort balloon shares at least one property with the first balloon, (b) determining at least one expected failure mode based at least in part on at least one failure of at least one cohort balloon, (c) determining a predicted failure mode of the first balloon based at least in part on the at least one expected failure mode, and (d) causing the first balloon to operate within the balloon network based at least in part on the predicted failure mode of the first balloon.

In yet another example, a system may include: (a) means for determining at least one cohort balloon of a first balloon, where the first balloon is operating as part of a balloon network and where each cohort balloon shares at least one property with the first balloon, (b) means for determining at least one expected failure mode based at least in part on at least one failure of at least one cohort balloon, (c) means for determining a predicted failure mode of the first balloon based at least in part on the at least one expected failure mode, and (d) means for causing the first balloon to operate within the balloon network based at least in part on the predicted failure mode of the first balloon.

These as well as other aspects, advantages, and alternatives, will become apparent to those of ordinary skill in the art by reading the following detailed description, with reference where appropriate to the accompanying figures.

DETAILED DESCRIPTION

I. Overview

Figure 1:
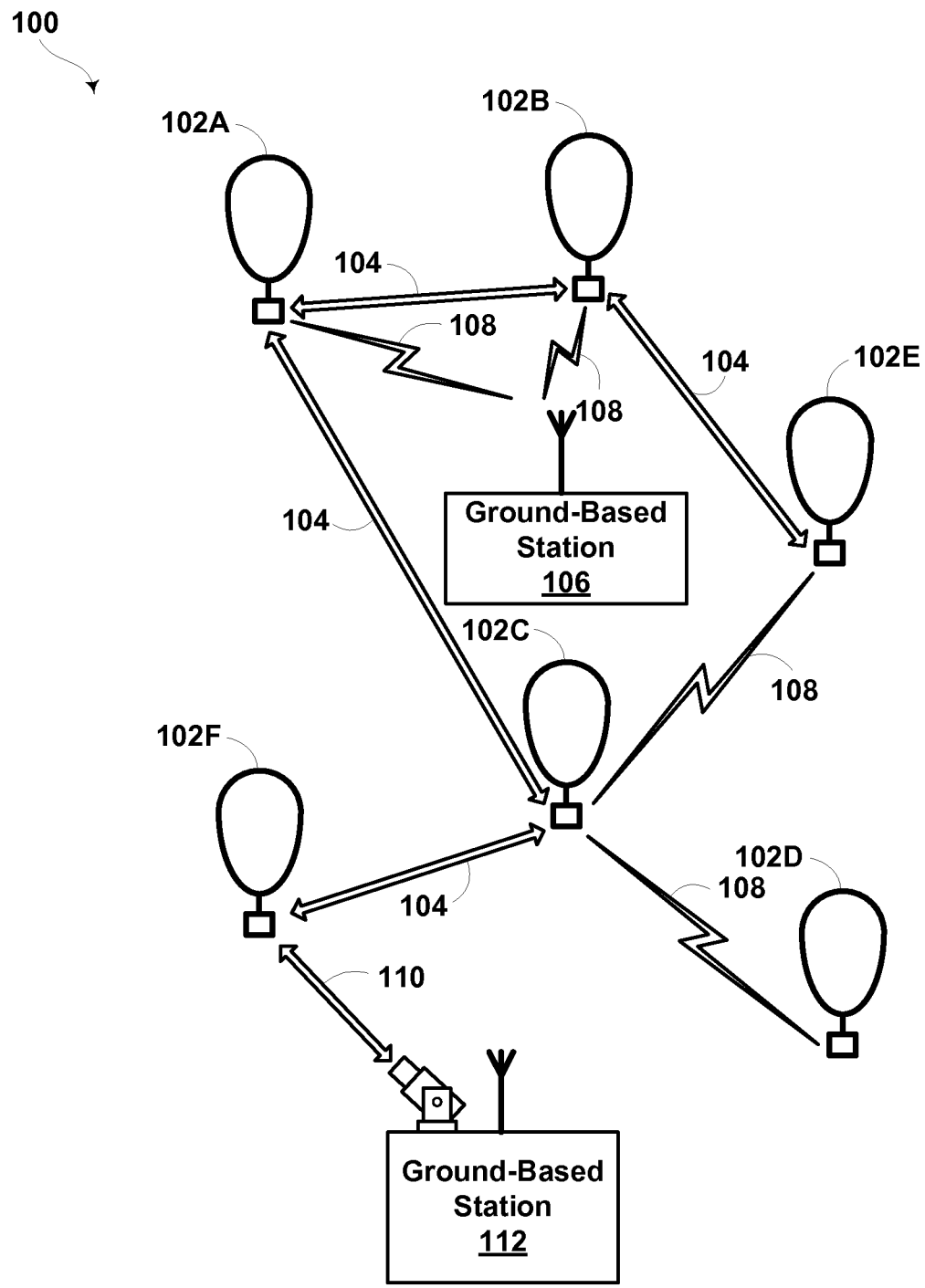
FIG. 1 is a block diagram illustrating an example balloon network.

Examples of methods and systems are described herein. It should be understood that the words "example" and "exemplary" are used herein to mean "serving as an example, instance, or illustration." Any embodiment or feature described herein as "exemplary" is not necessarily to be construed as preferred or advantageous over other embodiments or features. The example or exemplary embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the Figures should not be viewed as limiting. It should be understood that other embodiments may include more or less of each element shown in a given Figure. Further, some of the illustrated elements may be combined or omitted. Yet further, an exemplary embodiment may include elements that are not illustrated in the Figures.

Examples herein may be configured to help provide control of a data network that includes a plurality of balloons, for example, configured as a mesh network formed by high-altitude balloons deployed in the stratosphere. In some examples, different subsets of balloons may be given different tasks within the network. Further, a control system may be used to position balloons and/or assign tasks to particular balloons or subsets of balloons within the network. For instance, some balloons may provide local service to ground-based stations, other balloons may serve as relay nodes between balloons, while other balloons may be sent to provide service on long distance flight paths, and so on.

In some examples, predicted failure modes of individual balloons may be determined—that is, how and when individual balloons may be expected to fail. More specifically, a failure mode of a balloon may indicate a certain type of failure of an individual balloon component. Some failure modes may render the balloon entirely non-functional, while other failure modes may only make the balloon unusable for certain purposes. This information may be used to control the network of balloons by positioning balloons or subsets of balloons in particular locations and/or assigning particular tasks to the balloons. For instance, if it is known that an envelope of an individual balloon is about to fail, a control system may direct the balloon to an area where it can be recovered easily.

One method for predicting failures of individual balloons may involve determining expected failure modes for balloons within a "cohort," a group of balloons sharing certain properties with a specific target balloon. Example shared properties may include the same materials used to construct the balloons, the same manufacturer, the same model type, the same suppliers, or the same production line. In some examples, every balloon sharing a certain property may make up a cohort. In other examples, two balloons may be in the same cohort if they share a certain number of properties. For instance, a similarity metric indicating the similarity between a first balloon and a number of other individual balloons may be determined. Balloons sharing a similarity metric above a certain threshold may be treated as cohort balloons. Other methods for determining cohorts exist as well.

Information about failures of one or more cohort balloons of a target balloon may be compiled. This information may include failures of specific components within one or more of the cohort balloons. For instance, components that may fail include balloon envelopes, communication systems, propelling systems, power systems, or other mechanical or electrical systems. Additionally, information about the times-to-failure of individual components or of entire balloons may also be determined. Further, the information may include specific types of failures of a given component. For instance, a balloon envelope may experience a small hole that may lead to a slow loss of pressure or it may experience a rip in the envelope that may cause rapid balloon descent.

The cohort balloon failures may then be used to determine expected failure modes for other balloons within the cohort. For instance, information about times-to-failure of a certain component of the cohort balloons may be averaged together to determine when the same component of other balloons within the cohort is likely to fail. In some examples, a weighted average of different balloon failures may be determined. For instance, cohort balloons that are more similar to a specific target balloon may be given a greater weight. In other examples, information from cohort balloons that failed more recently in time may be given a greater weight. In a further example, a probability distribution of times-to-failure, or a failure rate curve, may be determined for entire balloons or balloon components as well or instead.

Further, the expected failure modes for a cohort may be updated over time. Additional failures of cohort balloons may be recorded and used to refine the expected failure modes for the cohort. This may be accomplished using a number of different machine learning techniques. For instance, Bayesian inference may be used to combine new evidence (cohort balloon failures) with prior beliefs (prior expected failure modes for the cohort) to determine more precise expected failure modes for the cohort.

Additionally, information about failures of multiple separate components and/or multiple types of failure may be determined for a cohort. In some examples, separate times-to-failure may be determined for separate components or for separate types of failure. In further examples, a failure of a certain component or a certain type of failure that is likely to occur at the earliest point in time may be determined for the cohort.

In further examples, a predicted failure mode for a specific target balloon may be determined based on expected failure modes of cohort balloons. Additionally, the predicted failure mode may be refined according to sensor data from active sensing done on the balloon. For example, sensors can be included within an envelope of the balloon to detect strain in the balloon material. These sensors may be used to detect stretching of balloon material or changes in the circumference of the balloon. Additionally, sound echoes may be used to detect deformity in balloon material. In some examples, it may be determined that a specific balloon has experienced an unusually high amount of strain in a particular component. Accordingly, the predicted failure mode may be refined to indicate that a failure in the component may occur earlier than expected.

In additional examples, the predicted failure mode for a specific target balloon may be refined according to information about the experiences of the balloon from the time of manufacturing to the present. For example, pressure gauges may be included which may detect the amount of pressure experienced by the balloon over time. It may be determined that a certain component of a balloon may be likely to fail when a certain pressure level is reached. In another example, ultraviolet light and temperature sensors may also be included inside or outside of the balloon to measure the balloon's exposure to various environmental conditions over time. In further examples, altitude sensors and/or GPS sensors may be used to determine the amount of time spent by the balloon at particular altitudes and/or in particular locations.

The predicted failure mode of a specific target balloon may be used to determine how to operate the balloon within the network. For example, if it is determined that a specific component of the balloon may be likely to fail soon, the balloon may be re-tasked to carry out different functions that don't require the component. As a further example, if the entire balloon may be likely to fail, the balloon may be moved to an area where it can easily be recovered. Thus, example methods can be performed to determine predicted failure modes of individual balloons within the network and to assign tasks and locations to individual balloons accordingly.

II. Example Balloon Networks

In order that the balloons can provide a reliable data network in the stratosphere, where winds may affect the locations of the various balloons in an asymmetrical manner, the balloons in an exemplary network may be configured move latitudinally and/or longitudinally relative to one another by adjusting their respective altitudes, such that the wind carries the respective balloons to the respectively desired locations.

Further, in an exemplary balloon network, the balloons may communicate with one another using free-space optical communications. For instance, the balloons may be configured for optical communications using ultrabright LEDs or possibly lasers for optical signaling (although regulations for laser communications may restrict laser usage). In addition, the balloons may communicate with ground-based station(s) using radio-frequency (RF) communications.

In some embodiments, a high-altitude-balloon network may be homogenous. More specifically, in a homogenous high-altitude-balloon network, each balloon is configured to communicate with nearby balloons via free-space optical links. Further, some or all of the balloons in such a network, may also be configured communicate with ground-based station(s) using RF communications. (Note that in some embodiments, the balloons may be homogenous in so far as each balloon is configured for free-space optical communication with other balloons, but heterogeneous with regard to RF communications with ground-based stations.)

In other embodiments, a high-altitude-balloon network may be heterogeneous, and thus may include two or more different types of balloons. For example, some balloons may be configured as super-nodes, while other balloons may be configured as sub-nodes. (Note also that some balloons may be configured to function as both a super-node and a sub-node.)

In such a configuration, the super-node balloons may be configured to communicate with nearby super-node balloons via free-space optical links. However, the sub-node balloons may not be configured for free-space optical communication, and may instead be configured for, e.g., RF communications. Accordingly, a super-node may be further configured to communicate with nearby sub-nodes using RF communications. The sub-nodes may accordingly relay communications from the super-nodes to ground-based station(s) using RF communications. Configured as such, the super-nodes may collectively function as backhaul for the balloon network, while the sub-nodes function to relay communications from the super-nodes to ground-based stations.

FIG. 1 is a simplified block diagram illustrating a balloon network 100, according to an exemplary embodiment. As shown, balloon network 100 includes balloons 102A to 102E, which are configured to communicate with one another via free-space optical links 104. Configured as such, balloons 102A to 102E may collectively function as a mesh network for packet-data communications. Further, balloons 102A to 102D may be configured for RF communications with ground-based stations 106 via RF links 108.

In an exemplary embodiment, balloons 102A to 102E are high-altitude balloons, which are deployed in the stratosphere. At moderate latitudes, the stratosphere includes altitudes between approximately 10 kilometers (km) and 50 km altitude above the surface. At the poles, the stratosphere starts at an altitude of approximately 8 km. In an exemplary embodiment, high-altitude balloons may be generally configured to operate in an altitude range within the stratosphere that has lower winds (e.g., between 5 and 20 miles per hour (mph)).

More specifically, in a high-altitude-balloon network, balloons 102A to 102E may generally be configured to operate at altitudes between 17 km and 22 km (although other altitudes are possible). This altitude range may be advantageous for several reasons. In particular, this layer of the stratosphere generally has mild wind and turbulence (e.g., winds between 5 and 20 miles per hour (mph)). Further, while the winds between 17 km and 22 km may vary with latitude and by season, the variations can be modeled in a reasonably accurate manner. Additionally, altitudes above 17 km are typically above the maximum flight level designated for commercial air traffic. Therefore, interference with commercial flights is not a concern when balloons are deployed between 17 km and 22 km.

To transmit data to another balloon, a given balloon 102A to 102E may be configured to transmit an optical signal via an optical link 104. In an exemplary embodiment, a given balloon 102A to 102E may use one or more high-power light-emitting diodes (LEDs) to transmit an optical signal. Alternatively, some or all of balloons 102A to 102E may include laser systems for free-space optical communications over optical links 104. Other types of free-space optical communication are possible. Further, In order to receive an optical signal from another balloon via an optical link 104, a given balloon 102A to 102E may include one or more optical receivers. Additional details of balloons implementations are discussed in greater detail below, with reference to FIG. 3.

In a further aspect, balloons 102A to 102D may utilize one or more of various different RF air-interface protocols for communication ground-based stations 106 via RF links 108. For instance, some or all of balloons 102A to 102D may be configured to communicate with ground-based stations 106 using protocols described in IEEE 802.11 (including any of the IEEE 802.11 revisions), various cellular protocols such as GSM, CDMA, UMTS, EV-DO, WiMAX, and/or LTE, and/or one or more propriety protocols developed for balloon-to-ground RF communication, among other possibilities.

In a further aspect, there may scenarios where RF links 108 do not provide a desired link capacity for balloon-to-ground communications. For instance, increased capacity may be desirable to provide backhaul links from a ground-based gateway, and in other scenarios as well. Accordingly, an exemplary network may also include downlink balloons, which provide a high-capacity air-to-ground link.

For example, in balloon network 100, balloon 102E is configured as a downlink balloon. Like other balloons in an exemplary network, a downlink balloon 102E may be operable for optical communication with other balloons via optical links 104. However, a downlink balloon 102E may also be configured for free-space optical communication with a ground-based station 112 via an optical link 110. Optical link 110 may therefore serve as a high-capacity link (as compared to an RF link 108) between the balloon network 100 and a ground-based station 108.

Note that in some implementations, a downlink balloon 102E may additionally be operable for RF communication with ground-based stations 106. In other cases, a downlink balloon 102E may only use an optical link for balloon-to-ground communications. Further, while the arrangement shown in FIG. 1 includes just one downlink balloon 102E, an exemplary balloon network can also include multiple downlink balloons. On the other hand, a balloon network can also be implemented without any downlink balloons.

In other implementations, a downlink balloon may be equipped with a specialized, high-bandwidth RF communication system for balloon-to-ground communications, instead of or in addition to a free-space optical communication system. The high-bandwidth RF communication system may take the form of an ultra-wideband system, which provides an RF link with substantially the same capacity as the optical links 104. Other forms are also possible.

Ground-based stations, such as ground-based stations 106 and/or 108, may take various forms. Generally, a ground-based station may include components such as transceivers, transmitters, and/or receivers for communication via RF links and/or optical links with a balloon network. Further, a ground-based station may use various air-interface protocols in order communicate with a balloon 102A to 102E over an RF link 108. As such, a ground-based station 106 may be configured as an access points via which various devices can connect to balloon network 100. Ground-based stations 106 may have other configurations and/or serve other purposes without departing from the scope of the invention.

Further, some ground-based stations, such as ground-based station 108, may be configured as gateways between balloon network 100 and one or more other networks. Such a ground-based station 108 may thus serve as an interface between the balloon network and the Internet, a cellular service provider's network, and/or other types of networks. Variations on this configuration and other configurations of a ground-based station 108 are also possible.

A. Mesh-Network Functionality

As noted, balloons 102A to 102E may collectively function as a mesh network. More specifically, since balloons 102A to 102E may communicate with one another using free-space optical links, the balloons may collectively function as a free-space optical mesh network.

In a mesh-network configuration, each balloon 102A to 102E may function as a node of the mesh network, which is operable to receive data direct to it and to route data to other balloons. As such, data may be routed from a source balloon to a destination balloon by determining an appropriate sequence of optical links between the source balloon and the destination balloon. These optical links may be collectively referred to as a "lightpath" for the connection between the source and destination balloons. Further, each of the optical links may be referred to as a "hop" on the lightpath.

Further, in order to operate as a mesh network, balloons 102A to 102E may employ various routing techniques and self-healing algorithms. In some embodiments, a balloon network 100 may employ adaptive or dynamic routing, where a lightpath between a source and destination balloon is determined and set-up when the connection is needed, and released at a later time. Further, when adaptive routing is used, the lightpath may be determined dynamically depending upon the current state, past state, and/or predicted state of the balloon network.

In addition, the network topology may change as the balloons 102A to 102E move relative to one another and/or relative to the ground. Accordingly, an exemplary balloon network 100 may apply a mesh protocol to update the state of the network as the topology of the network changes. For example, to address the mobility of the balloons 102A to 102E, balloon network 100 may employ and/or adapt various techniques that are employed in mobile ad hoc networks (MANETs). Other examples are possible as well.

In some implementations, a balloon network 100 may be configured as a transparent mesh network. More specifically, in a transparent balloon network, the balloons may include components for physical switching that is entirely optical, without any electrical involved in physical routing of optical signals. Thus, in a transparent configuration with optical switching, signals travel through a multi-hop lightpath that is entirely optical.

In other implementations, the balloon network 100 may implement a free-space optical mesh network that is opaque. In an opaque configuration, some or all balloons 102A to 102E may implement optical-electrical-optical (OEO) switching. For example, some or all balloons may include optical cross-connects (OXCs) for OEO conversion of optical signals. Other opaque configurations are also possible.

In a further aspect, balloons in an exemplary balloon network 100 may implement wavelength division multiplexing (WDM), which may help to increase link capacity. When WDM is implemented with transparent switching, physical lightpaths through the balloon network may be subject to the "wavelength continuity constraint." More specifically, because the switching in a transparent network is entirely optical, it may be necessary to assign the same wavelength for all optical links on a given lightpath.

An opaque configuration, on the other hand, may avoid the wavelength continuity constraint. In particular, balloons in an opaque balloon network may include the OEO switching systems operable for wavelength conversion. As a result, balloons can convert the wavelength of an optical signal at each hop along a lightpath.

Further, various routing algorithms may be employed in an opaque configuration. For example, to determine a primary lightpath and/or one or more diverse backup lightpaths for a given connection, exemplary balloons may apply or consider shortest-path routing techniques such as Dijkstra's algorithm and k-shortest path, and/or edge and node-diverse or disjoint routing such as Suurballe's algorithm, among others. Additionally or alternatively, techniques for improving QoS may be employed when determining a lightpath. Other techniques are also possible.

B. Station-Keeping Functionality

In an exemplary embodiment, a balloon network 100 may implement station-keeping functions to help provide a desired network topology. For example, station-keeping may involve each balloon 102A to 102E maintaining and/or moving into a certain position relative to one or more other balloons in the network (and possibly in a certain position relative to the ground). As part of this process, each balloon 102A to 102E may implement station-keeping functions to determine its desired positioning within the desired topology, and if necessary, to determine how to move to the desired position.

The desired topology may vary depending upon the particular implementation. In some cases, balloons may implement station-keeping to provide a substantially uniform topology. In such case, a given balloon 102A to 102E may implement station-keeping functions to position itself at substantially the same distance (or within a certain range of distances) from adjacent balloons in the balloon network 100.

In other cases, a balloon network 100 may have a non-uniform topology. For instance, exemplary embodiments may involve topologies where balloons are distributed more or less densely in certain areas, for various reasons. As an example, to help meet the higher bandwidth demands that are typical in urban areas, balloons may be clustered more densely over urban areas. For similar reasons, the distribution of balloons may be denser over land than over large bodies of water. Many other examples of non-uniform topologies are possible.

In a further aspect, the topology of an exemplary balloon network may be dynamic and adaptable. In particular, station-keeping functionality of exemplary balloons may allow the balloons to adjust their respective positioning in accordance with a change in the desired topology of the network. For example, one or more balloons could move to new positions to increase or decrease the density of balloons in a given area. Further, in some embodiments, balloons may be in continuous or nearly continuous motion, and station-keeping may involve moving balloons so as to try to meet certain requirements for e.g., coverage in various areas.

In some embodiments, a balloon network 100 may employ an energy function to determine if and/or how balloons should move to provide a desired topology. In particular, the state of a given balloon and the states of some or all nearby balloons may be input to an energy function. The energy function may apply the current states of the given balloon and the nearby balloons to a desired network state (e.g., a state corresponding to the desired topology). A vector indicating a desired movement of the given balloon may then be determined by determining the gradient of the energy function. The given balloon may then determine appropriate actions to take in order to effectuate the desired movement. For example, a balloon may determine an altitude adjustment or adjustments such that winds will move the balloon in the desired manner.

C. Control of Balloons in a Balloon Network

Figure 2:
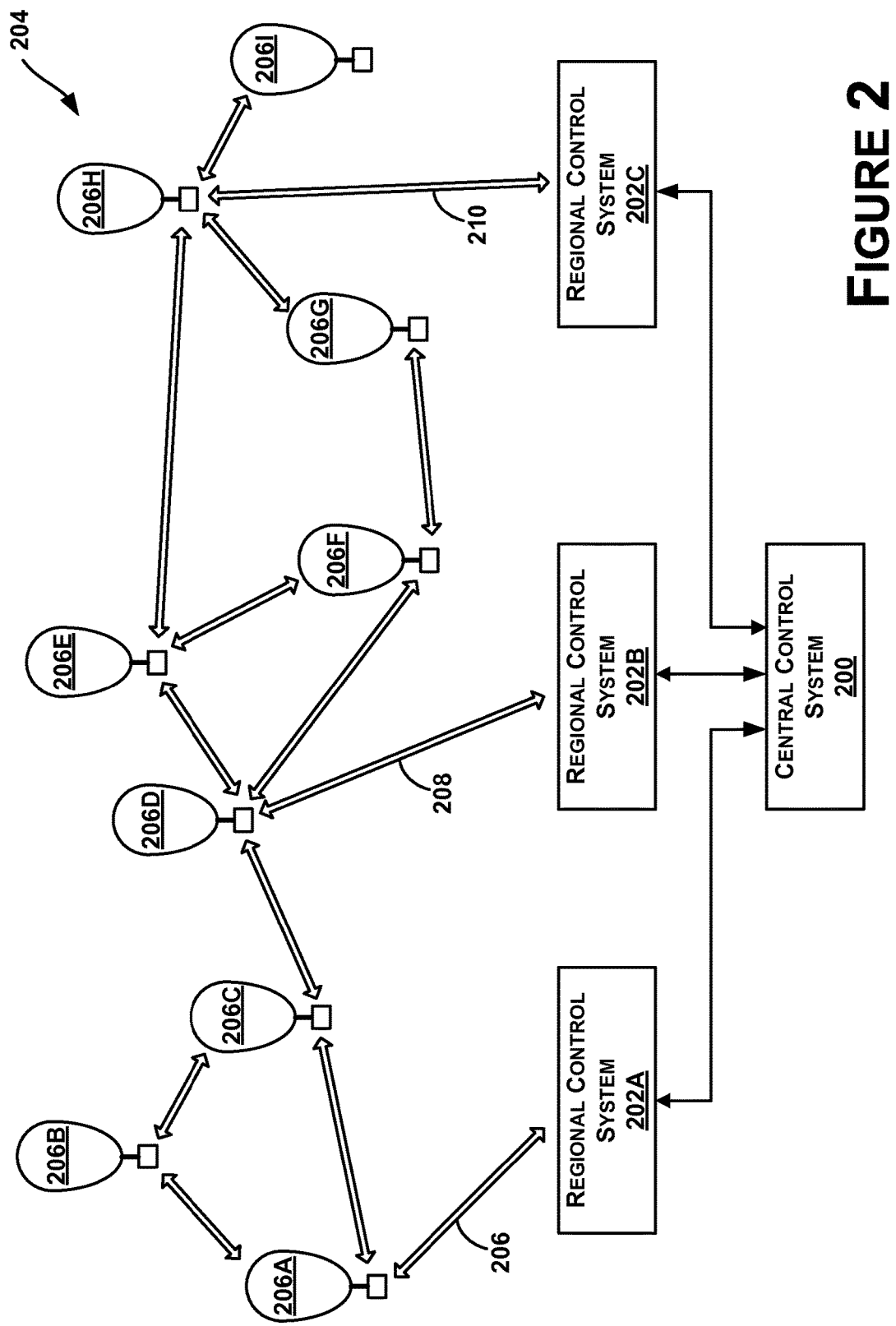
FIG. 2 is a block diagram illustrating an example balloon-network control system.

In some embodiments, mesh networking and/or station-keeping functions may be centralized. For example, FIG. 2 is a block diagram illustrating a balloon-network control system, according to an exemplary embodiment. In particular, FIG. 2 shows a distributed control system, which includes a central control system 200 and a number of regional control-systems 202A to 202B. Such a control system may be configured to coordinate certain functionality for balloon network 204, and as such, may be configured to control and/or coordinate certain functions for balloons 206A to 206I.

In the illustrated embodiment, central control system 200 may be configured to communicate with balloons 206A to 206I via number of regional control systems 202A to 202C. These regional control systems 202A to 202C may be configured to receive communications and/or aggregate data from balloons in the respective geographic areas that they cover, and to relay the communications and/or data to central control system 200. Further, regional control systems 202A to 202C may be configured to route communications from central control system 200 to the balloons in their respective geographic areas. For instance, as shown in FIG. 2, regional control system 202A may relay communications and/or data between balloons 206A to 206C and central control system 200, regional control system 202B may relay communications and/or data between balloons 206D to 206F and central control system 200, and regional control system 202C may relay communications and/or data between balloons 206G to 206I and central control system 200.

In order to facilitate communications between the central control system 200 and balloons 206A to 206I, certain balloons may be configured as downlink balloons, which are operable to communicate with regional control systems 202A to 202C. Accordingly, each regional control system 202A to 202C may be configured to communicate with the downlink balloon or balloons in the respective geographic area it covers. For example, in the illustrated embodiment, balloons 204A, 204D, and 204H are configured as downlink balloons. As such, regional control systems 202A to 202C may respectively communicate with balloons 204A, 204D, and 204H via optical links 206, 208, and 210, respectively.

In the illustrated configuration, where only some of balloons 206A to 206I are configured as downlink balloons, the balloons 206A, 206D, and 206H that are configured as downlink balloons may function to relay communications from central control system 200 to other balloons in the balloon network, such as balloons 206B, 206C, 206E to 206G, and 206I. However, it should be understood that it in some implementations, it is possible that all balloons may function as downlink balloons. Further, while FIG. 2 shows multiple balloons configured as downlink balloons, it is also possible for a balloon network to include only one downlink balloon.

Note that a regional control system 202A to 202B may in fact just be particular type of ground-based station that is configured to communicate with downlink balloons (e.g., such as ground-based station 112 of FIG. 1). Thus, while not shown in FIG. 2, the control system shown in FIG. 2 may be implemented in conjunction with other types of ground-based stations (e.g., access points, gateways, etc.).

In a centralized control arrangement, such as that shown in FIG. 2, the central control system 200 (and possibly regional control systems 202A to 202C as well) may coordinate certain mesh-networking functions for balloon network 204. For example, balloons 206A to 206I may send the central control system 200 certain state information, which the central control system 200 may utilize to determine the state of balloon network 204. The state information from a given balloon may include location data, optical-link information (e.g., the identity of other balloons with which the balloon has established an optical link, the bandwidth of the link, wavelength usage and/or availability on a link, etc.), wind data collected by the balloon, and/or other types of information. Accordingly, the central control system 200 may aggregate state information from some or all the balloons 206A to 206I in order to determine an overall state of the network.

The overall state of the network may then be used to coordinate and/or facilitate certain mesh-networking functions such as determining lightpaths for connections. For example, the central control system 200 may determine a current topology based on the aggregate state information from some or all the balloons 206A to 206I. The topology may provide a picture of the current optical links that are available in balloon network and/or the wavelength availability on the links. This topology may then be sent to some or all of the balloons so that a routing technique may be employed to select appropriate lightpaths (and possibly backup lightpaths) for communications through the balloon network 204.

In a further aspect, the central control system 200 (and possibly regional control systems 202A to 202C as well) may also coordinate certain station-keeping functions for balloon network 204. For example, the central control system 200 may input state information that is received from balloons 206A to 206I to an energy function, which may effectively compare the current topology of the network to a desired topology, and provide a vector indicating a direction of movement (if any) for each balloon, such that the balloons can move towards the desired topology. Further, the central control system 200 may use altitudinal wind data to determine respective altitude adjustments that may be initiated to achieve the movement towards the desired topology. The central control system 200 may provide and/or support other station-keeping functions as well.

As noted, FIG. 2 shows a distributed-control arrangement, with regional control systems 202A to 202C coordinating communications between a central control system 200 and a balloon network 204. Such an arrangement may be useful in a balloon network that covers a large geographic area. In some embodiments, a distributed control system may even support a global balloon network that provides coverage everywhere on earth. Of course, a distributed-control arrangement may be useful in other scenarios as well.

Further, it should be understood that other control-system arrangements are possible. For instance, some implementations may involve a distributed control system with additional layers (e.g., sub-region systems within the regional control systems, and so on). Alternatively, control functions may be provided by a single, centralized, control system, which communicates directly with one or more downlink balloons.

In a further aspect, control and coordination of a balloon network may be shared between a ground-based control system and a balloon network to varying degrees, depending upon the implementation. In fact, in some embodiments, there may be no ground-based control system. In such an embodiment, all network control and coordination functions may be implemented by the balloon network itself. For example, certain balloons may be configured to provide the same or similar functions as central control system 200 and/or regional control systems 202A to 202C. Other examples are also possible.

Furthermore, control and/or coordination of a balloon network may be de-centralized. For example, each balloon may relay state information to, and receive state information from, some or all nearby balloons. Further, each balloon may relay state information that it receives from a nearby balloon to some or all nearby balloons. When all balloons do so, each balloon may be able to individually determine the state of the network. Alternatively, certain balloons may be designated to aggregate state information for a given portion of the network. These balloons may then coordinate with one another to determine the overall state of the network.

Further, in some aspects, control of a balloon network may be partially or entirely localized, such that it is not dependent on the overall state of the network. For example, individual balloons may implement station-keeping functions that only consider nearby balloons. In particular, each balloon may implement an energy function that takes into account its own state and the states of nearby balloons. The energy function may be used to maintain and/or move to a desired position with respect to the nearby balloons, without necessarily considering the desired topology of the network as a whole. However, when each balloon implements such an energy function for station-keeping, the balloon network as a whole may maintain and/or move towards the desired topology.

D. Illustrative Balloon Configurations

Figure 3:
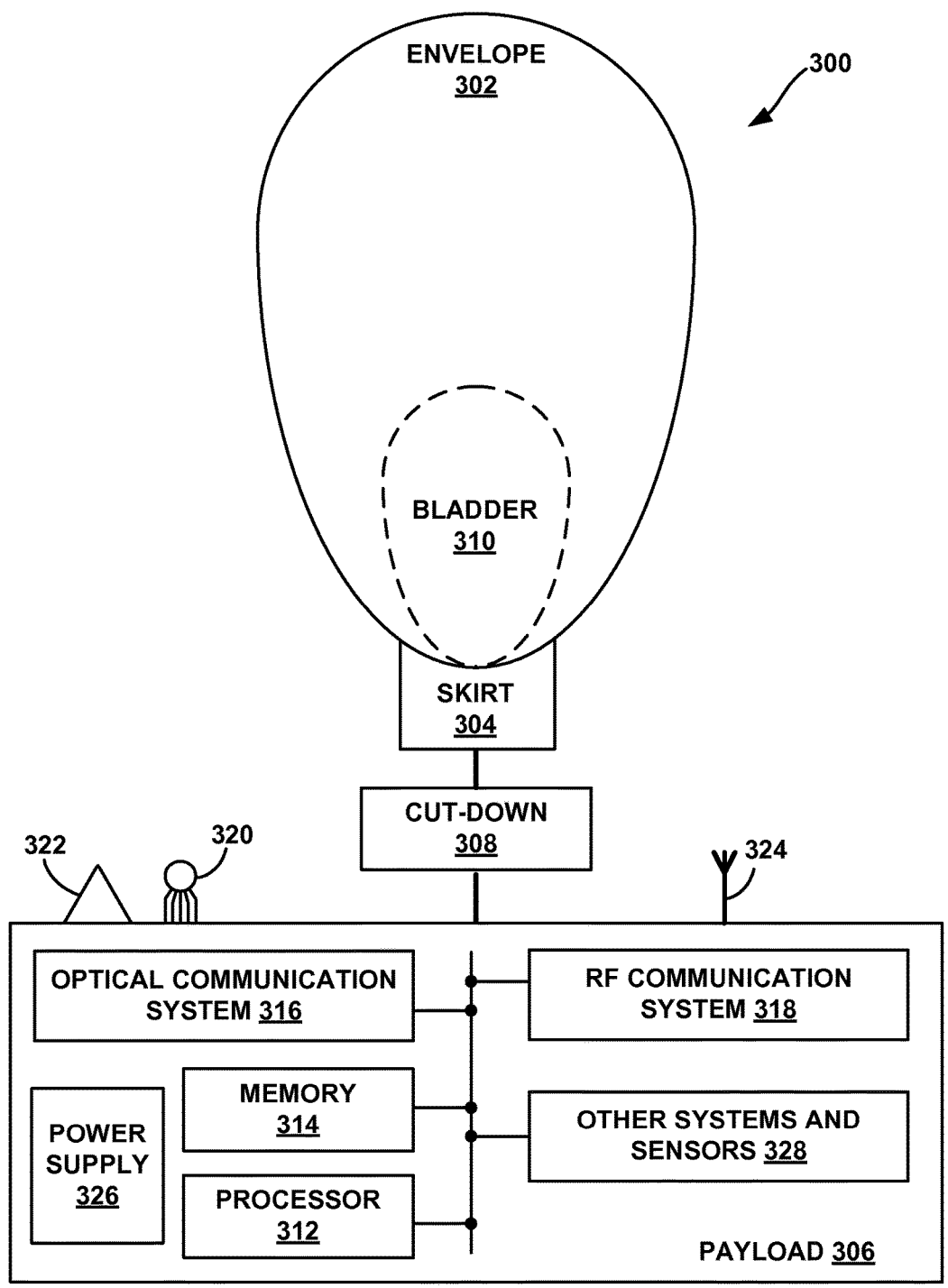
FIG. 3 shows a high-altitude balloon according to an example embodiment.

Various types of balloon systems may be incorporated in an exemplary balloon network. As noted above, an exemplary embodiment may utilize high-altitude balloons, which typically operate in an altitude range between 17 km and 22 km. FIG. 3 is a simplified block diagram illustrating a high-altitude balloon 300, according to an exemplary embodiment. As shown, the balloon 300 includes an envelope 302, a skirt 304, a payload 306, and a cut-down system 308 that is attached between the balloon 302 and payload 304.

The envelope 302 and skirt 304 may take various forms, which may be currently well-known or yet to be developed. For instance, the envelope 302 and/or skirt 304 may be made of a highly-flexible latex material or may be made of a rubber material such as chloroprene. Other materials are also possible. Further, the shape and size of the envelope 302 and skirt 304 may vary depending upon the particular implementation. Additionally, the envelope 302 may be filled with various different types of gases, such as helium and/or hydrogen. Other types of gases are possible as well.

The payload 306 of balloon 300 may include a processor 312 and on-board data storage, such as memory 314. The memory 314 may take the form of or include a non-transitory computer-readable medium. The non-transitory computer-readable medium may have instructions stored thereon, which can be accessed and executed by the processor 312 in order to carry out the balloon functions described herein.

The payload 306 of balloon 300 may also include various other types of equipment and systems to provide a number of different functions. For example, payload 306 may include optical communication system 316, which may transmit optical signals via an ultra-bright LED system 320, and which may receive optical signals via an optical-communication receiver 322 (e.g., a photo-diode receiver system). Further, payload 306 may include an RF communication system 318, which may transmit and/or receive RF communications via an antenna system 324. The payload 306 may also include a power supply 326 to supply power to the various components of balloon 300.

Further, payload 306 may include various types of other systems and sensors 328. For example, payload 306 may include one or more video and/or still cameras, a GPS system, various motion sensors (e.g., accelerometers, gyroscopes, and/or compasses), and/or various sensors for capturing environmental data. Further, some or all of the components within payload 306 may be implemented in a radiosonde, which may be operable to measure, e.g., pressure, altitude, geographical position (latitude and longitude), temperature, relative humidity, and/or wind speed and/or direction, among other information.

As noted, balloon 306 includes an ultra-bright LED system 320 for free-space optical communication with other balloons. As such, optical communication system 316 may be configured to transmit a free-space optical signal by modulating the ultra-bright LED system 320. The optical communication system 316 may be implemented with mechanical systems and/or with hardware, firmware, and/or software. Generally, the manner in which an optical communication system is implemented may vary, depending upon the particular application.

In a further aspect, balloon 300 may be configured for altitude control. For instance, balloon 300 may include a variable buoyancy system, which is configured to change the altitude of the balloon 300 by adjusting the volume and/or density of the gas in the balloon 300. A variable buoyancy system may take various forms, and may generally be any system that can change the volume and/or density of gas in envelope 302.

In an exemplary embodiment, a variable buoyancy system may include a bladder 310 that is located inside of envelope 302. The buoyancy of the balloon 300 may therefore be adjusted by changing the density and/or volume of the gas in bladder 310. To change the density in bladder 310, balloon 300 may be configured with systems and/or mechanisms for heating and/or cooling the gas in bladder 310. Further, to change the volume, balloon 300 may include pumps or other features for adding gas to and/or removing gas from bladder 310. Additionally or alternatively, to change the volume of bladder 310, balloon 300 may include release valves or other features that are controllable to allow air to escape from bladder 310.

Further, the balloon 300 may include a navigation system (not shown). The navigation system may implement station-keeping functions to maintain position within and/or move to a position in accordance with a desired topology. In particular, the navigation system may use altitudinal wind data to determine altitudinal adjustments that result in the wind carrying the balloon in a desired direction and/or to a desired location. The altitude-control system may then make adjustments to the density of the balloon chamber in order to effectuate the determined altitudinal adjustments and cause the balloon to move laterally to the desired direction and/or to the desired location.

Alternatively, the altitudinal adjustments may be computed by a ground-based control system and communicated to the high-altitude balloon. As another alternative, the altitudinal adjustments may be computed by a ground-based or satellite-based control system and communicated to the high-altitude balloon. Furthermore, in some embodiments, specific balloons in a heterogeneous balloon network may be configured to compute altitudinal adjustments for other balloons and transmit the adjustment commands to those other balloons.

As shown, the balloon 300 also includes a cut-down system 308. The cut-down system 308 may be activated to separate the payload 306 from the rest of balloon 300. This functionality may be utilized anytime the payload needs to be accessed on the ground, such as when it is time to remove balloon 300 from a balloon network, when maintenance is due on systems within payload 306, and/or when power supply 326 needs to be recharged or replaced.

In an alternative arrangement, a balloon may not include a cut-down system. In such an arrangement, the navigation system may be operable to navigate the balloon to a landing location, in the event the balloon needs to be removed from the network and/or accessed on the ground. Further, it is possible that a balloon may be self-sustaining, such that it theoretically does not need to be accessed on the ground.

Note that movement and locations of balloons, such as balloon 300, can vary since winds in the stratosphere may affect the locations of the balloons in a differential manner. A balloon in an example network may be configured to change its horizontal position by adjusting its vertical position (i.e., altitude). For example, by adjusting its altitude, a balloon may be able to find winds that will carry the balloon horizontally (e.g., latitudinally and/or longitudinally) to a desired horizontal location. Wind speed and/or direction may vary with altitude, and since current wind velocities as well as weather forecasts are available, in principle, a balloon may be directed to a location by identifying an altitude at which a wind direction takes a balloon to along a desired trajectory. However, a balloon without other forms of propulsion may be constrained to follow the wind and there may not be a single altitude with winds taking the balloon along the desired trajectory. In addition, to control a fleet of balloons, movement of the balloons should occur from one location above the surface of the Earth to another in a predictable manner.

E. Example Heterogeneous Network

In some embodiments, a high-altitude-balloon network may include super-node balloons, which communicate with one another via optical links, as well as sub-node balloons, which communicate with super-node balloons via RF links. Generally, the optical links between super-node balloons have more bandwidth than the RF links between super-node and sub-node balloons. As such, the super-node balloons may function as the backbone of the balloon network, while the sub-nodes may provide sub-networks providing access to the balloon network and/or connecting the balloon network to other networks.

Figure 4:
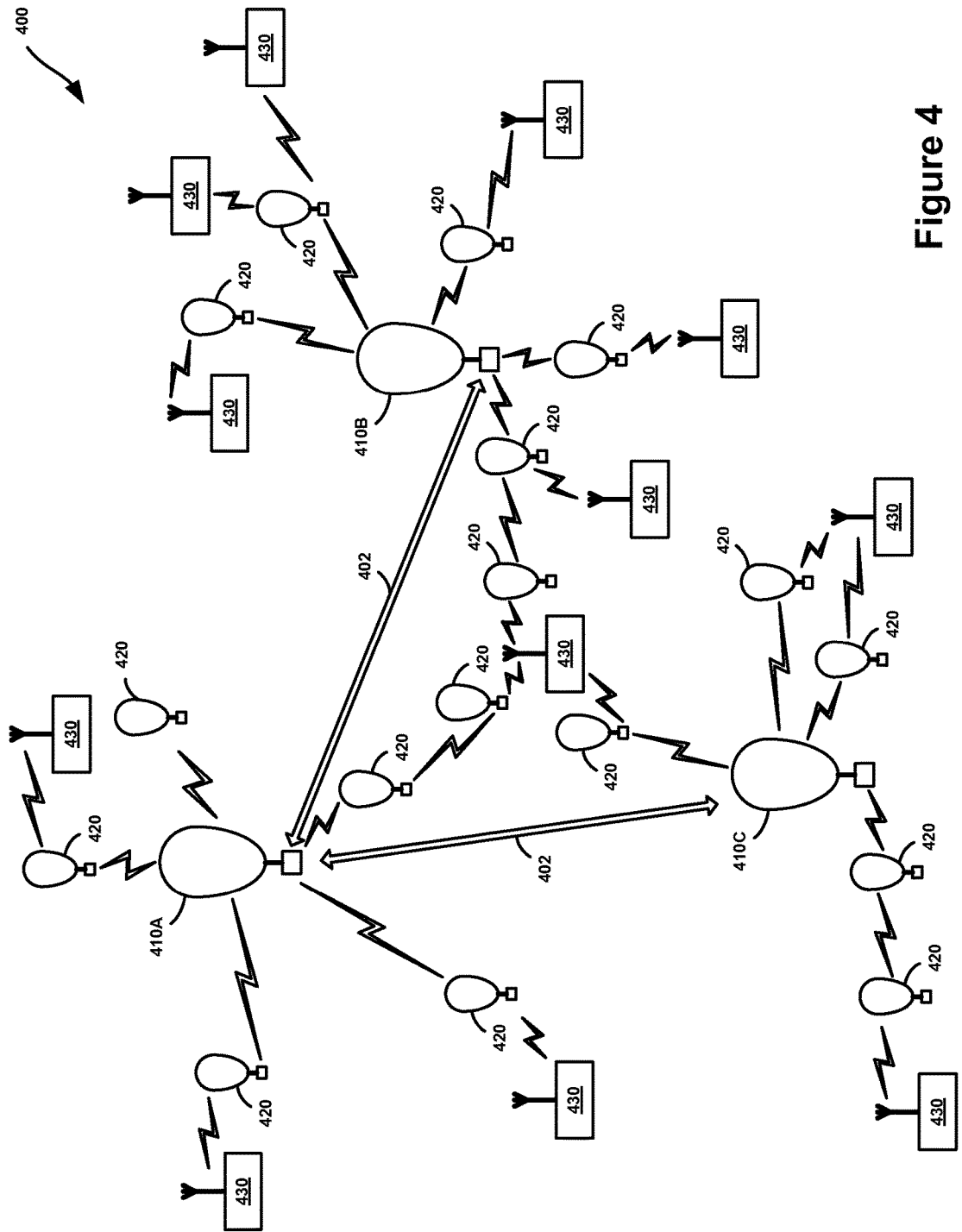
FIG. 4 is a simplified block diagram illustrating a balloon network that includes super-nodes and sub-nodes, according to an example embodiment.

FIG. 4 is a simplified block diagram illustrating a balloon network that includes super-nodes and sub-nodes, according to an exemplary embodiment. More specifically, FIG. 4 illustrates a portion of a balloon network 400 that includes super-node balloons 410A to 410C (which may also be referred to as "super-nodes") and sub-node balloons 420 (which may also be referred to as "sub-nodes").

Each super-node balloon 410A to 410C may include a free-space optical communication system that is operable for packet-data communication with other super-node balloons. As such, super-nodes may communicate with one another over optical links. For example, in the illustrated embodiment, super-node 410A and super-node 401B may communicate with one another over optical link 402, and super-node 410A and super-node 401C may communicate with one another over optical link 404.

Each of the sub-node balloons 420 may include a radio-frequency (RF) communication system that is operable for packet-data communication over one or more RF air interfaces. Accordingly, each super-node balloon 410A to 410C may include an RF communication system that is operable to route packet data to one or more nearby sub-node balloons 420. When a sub-node 420 receives packet data from a super-node 410, the sub-node 420 may use its RF communication system to route the packet data to a ground-based station 430 via an RF air interface.

As noted above, the super-nodes 410A to 410C may be configured for both longer-range optical communication with other super-nodes and shorter-range RF communications with nearby sub-nodes 420. For example, super-nodes 410A to 410C may use using high-power or ultra-bright LEDs to transmit optical signals over optical links 402, 404, which may extend for as much as 100 miles, or possibly more. Configured as such, the super-nodes 410A to 410C may be capable of optical communications at speeds of 10 to 50 GB/sec.

A larger number of balloons may then be configured as sub-nodes, which may communicate with ground-based Internet nodes at speeds on the order of approximately 10 MB/sec. Configured as such, the sub-nodes 420 may be configured to connect the super-nodes 410 to other networks and/or to client devices.

Note that the data speeds and link distances described in the above example and elsewhere herein are provided for illustrative purposes and should not be considered limiting; other data speeds and link distances are possible.

In some embodiments, the super-nodes 410A to 410C may function as a core network, while the sub-nodes 420 function as one or more access networks to the core network. In such an embodiment, some or all of the sub-nodes 420 may also function as gateways to the balloon network 400. Additionally or alternatively, some or all of ground-based stations 430 may function as gateways to balloon network 400.

III. Example Methods

Figure 5:
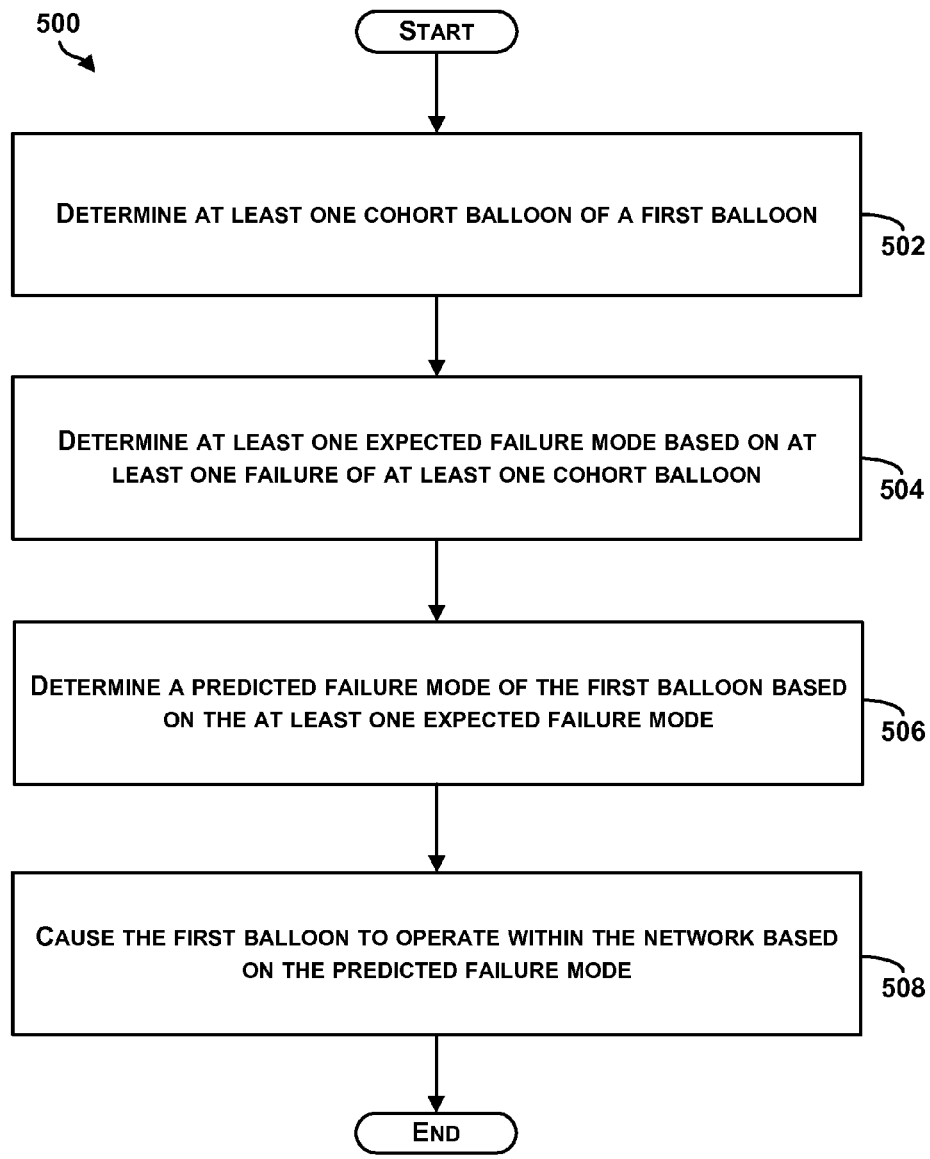
FIG. 5 is a block diagram of a method, according to an example embodiment.

FIG. 5 is a block diagram of a method, according to an example embodiment.

The method 500 may be carried out by a control system of a balloon network. For example, some or all of method 500 may be carried out by a central control system and/or regional systems such as the ones described above with respect to FIG. 2. The control system(s) may communicate with the balloons within the balloon network. In further examples, all or some of method 500 may be carried out by one or more computing systems located on the individual balloons. In some examples, the parts of the method 500 may be combined, separated into additional parts, and/or carried out in a different order than shown. Other configurations are also possible.

More specifically, the method 500 may involve determining one or more cohort balloons of a first balloon, as shown by block 502. The method 500 may further involve determining one or more expected failure modes based on at least one failure of one or more of the cohort balloons, as shown by block 504. The method 500 may further involve determining a predicted failure mode of the first balloon based at least on the expected failure modes, as shown by block 506. The method 500 may further involve causing the first balloon to operate within the network based on the predicted failure mode, as shown by block 508.

Method 500 may involve determining one or more cohort balloons of a first balloon, as shown by block 502. A cohort may be a group of balloons that share one or more properties with the first balloon. An example shared property may include a type of material used to construct the balloons, such as a material used to construct a part of the balloon envelopes. An example shared property may also include the model type of the balloons. Some networks may contain balloons of different types, which may have different shapes, sizes, equipment, etc. An example shared property may also include the manufacturer of the balloons and/or the suppliers of certain balloon components. An example shared property may further include the production line in which the balloon was created. Many other examples of properties shared by cohort balloons exist as well.

In some examples, every balloon sharing a certain property may make up a cohort. For example, one cohort of balloons may be every balloon made by a certain manufacturer. A second cohort of balloons may be every balloon of a certain model type (regardless of manufacturer). A third cohort may be every balloon containing a certain component from a particular supplier (regardless of manufacturer and model type). And so on.

In other examples, two balloons may be in the same cohort if they share a certain number of properties above a threshold number. For example, balloons may be in the same cohort only if they share at least two properties or at least three properties. In additional examples, a similarity metric may be determined between pairs of balloons, where the similarity metric indicates an amount of similarity between the two balloons. For instance, a similarity metric of 0 may indicate that the two balloons share no properties in common. A similarity metric of 1 may indicate that the two balloons share every property in common. A similarity metric may be defined and determined in other ways as well. Balloons sharing a similarity metric above a certain threshold may be treated as cohort balloons.

In additional examples, a "nearest neighbour" approach may be used to determine cohort balloons. A certain number of balloons most similar to or sharing the most properties with a certain target balloon may be determined. For instance, the five most similar balloons to a specific target balloon or the fifty most similar balloons or the five-hundred most similar balloons may be identified. Then, the group of a certain number of most similar balloons may be defined as the cohort balloons of a specific target balloon.

In further examples, clustering may be used to identify cohort balloons of a specific target balloon. For instance, balloons may be broken down into groups of balloons that tend to share similar long-term outcomes. In some examples, every group, or cluster, may be disjoint from every other group. Accordingly, the set of cohort balloons for a given target balloon may be every balloon sharing the same cluster with the target balloon. Other methods of determining cohort balloons exist as well.

In additional examples, cohorts can be modified as more information is learned about failures of individual balloons. For example, regression analysis may be used to determine which properties may be most useful in predicting long-term outcomes for individual balloons. Cohorts may then be modified or redefined to provide better predictive models. It may be determined that certain properties are highly correlated with certain types of failure while other properties are not as well correlated. In some examples, cohorts may be defined to take advantage of the most predictive properties.

Method 500 may involve determining at least one expected failure mode based on at least one failure of at least one cohort balloon, as shown by block 504. In some examples, an expected failure mode may include an expected failure of a particular balloon component. For instance, it may be determined that a cohort of balloons may be likely to experience a failure in an envelope, a communication system, a propelling system, a power system, and/or another mechanical or electrical systems in a certain amount of time. Additionally, an expected failure mode may include a time-to-failure of an individual component and/or of the entire balloon. For instance, a failure in the balloon envelope may indicate a failure of the entire balloon because the balloon may be entirely unusable within the network. Alternatively, a failure of communication system may indicate that the balloon may still serve some useful functions within the network.

Further, in some examples, an expected failure mode may include a specific type of failure of a given component. For instance, some types of failures may be instantly catastrophic, such as when a balloon envelope bursts. Other types of failures may be slow-acting, taking days or months or years to progress to complete failure. For instance, a balloon may experience a small leak, but may still be able to operate within the network for a significant period of time. Many other examples of different types of failures of balloon components exist as well.

Figure 6:
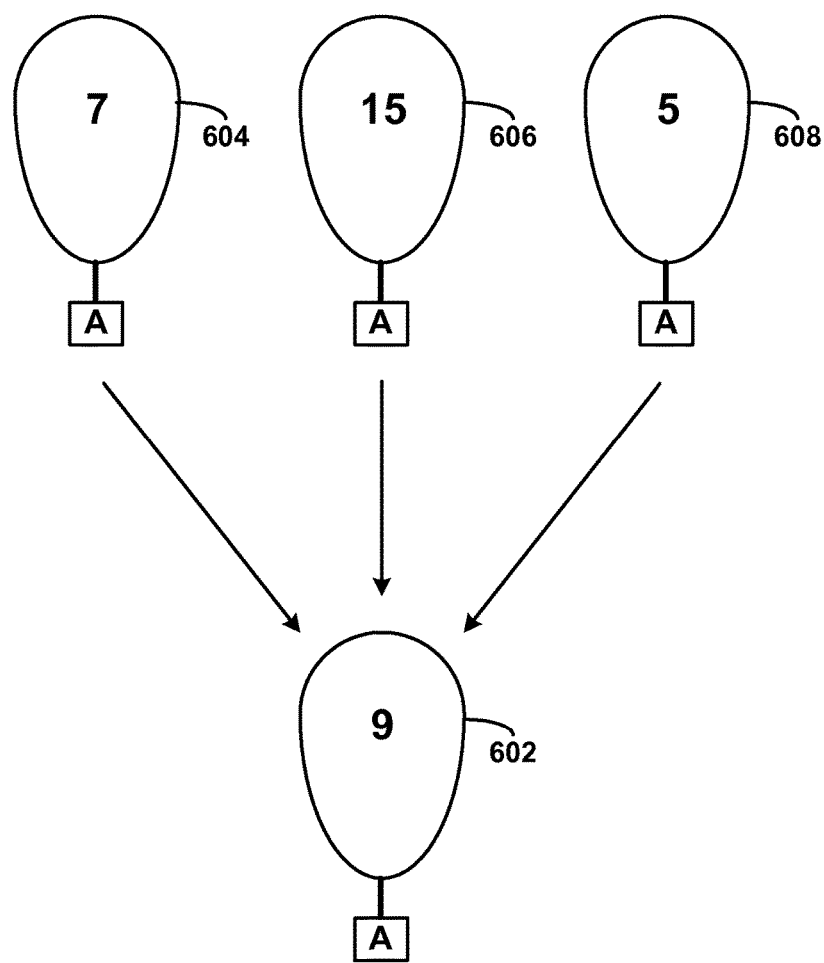
FIG. 6 illustrates the determination of an expected failure mode using cohort balloons, according to an example embodiment.

FIG. 6 illustrates the determination of an expected failure mode using cohort balloons, according to an example embodiment. One or more cohort balloons of a first balloon 602 may be determined using one of the methods described above, for example. Information about previous failures (including failed components, different kinds of failure, times-to-failure, etc.) may be determined for one or more of the cohort balloons. In this example, three cohort balloons 604, 606, 608 experiencing a failure are shown, but any number of cohort balloon failures may be determined.

In this example, one cohort balloon 604 may have experienced a particular failure mode, such as a failure of a certain component, in seven years. A second cohort balloon 606 may have experienced the same failure mode, or a similar type of a failure, in fifteen years. A third cohort balloon 608 may also have experienced the same failure mode in five years. Accordingly, this information may be combined in order to determine an expected failure mode of the cohort. For instance, the times-to-failure of the cohort balloons may be averaged together to determine an expected time-to-failure of this particular component in the first balloon 602 of nine years (the average of seven, fifteen, and five).

Figure 7:
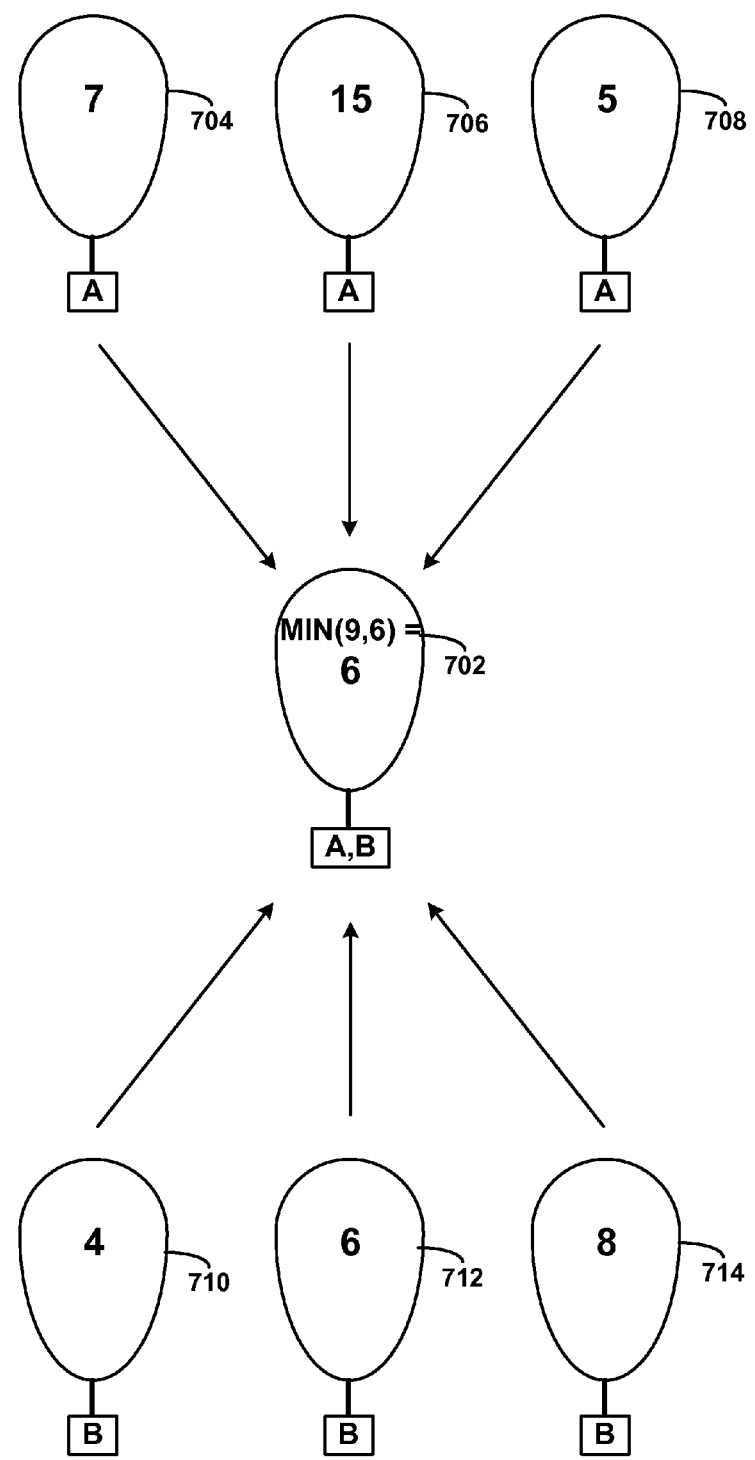
FIG. 7 illustrates the determination of an expected failure mode using cohort balloons with two different failure modes, according to an example embodiment.

FIG. 7 illustrates the determination of an expected failure mode using cohort balloons with two different failure modes, according to an example embodiment. In some examples, different cohort balloons may have experienced different types of failures or failures of different components. For instance, three cohort balloons 704, 706, 708 of a first balloon 702 may have each experienced a failure in a particular component A. Further, three additional cohort balloons 710, 712, 714 of the first balloon 702 may have each experienced a failure in another particular component B. It should be understood that one cohort balloon could experience multiple failures, and could therefore be included in both groups of cohort balloons in some instances.

In some examples, an expected failure mode may be a type of failure that is likely to occur at the earliest point in time. For instance, in this example, an expected time-to-failure of the component A may first be determined from the cohort balloons 704, 706, 708 that experienced a failure in component A. For example, if cohort balloon 704 experienced a failure of component A in seven years, cohort balloon 706 experienced a failure of component A in fifteen years, and cohort balloon 708 experienced a failure of component A in five years, an expected time-to-failure of component A within the cohort may be determined to be nine years (the average seven, fifteen, and five).

Furthermore, an expected time-to-failure of the component B may also be determined from the cohort balloons 710, 712, 714 that experienced a failure in component B. For example, if cohort balloon 710 experienced a failure of component B in four years, cohort balloon 706 experienced a failure of component B in six years, and cohort balloon 708 experienced a failure of component B in eight years, an expected time-to-failure of component B within the cohort may be determined to be six years (the average six, eight, and ten).

In this simplified example, it may then be determined that a failure of component B is expected to occur at an earlier point in time (in six years) than a failure of component A (in nine years). Accordingly, a prediction may be made about a likely failure mode of the first balloon 702. Additionally, it should be understood that information about failures of other components and/or other types of failure may be determined for cohort balloons. Accordingly, a predictive model may be developed that may allow for the predictions of multiple different failure modes and corresponding times-to-failure for a given target balloon.

Figure 8:
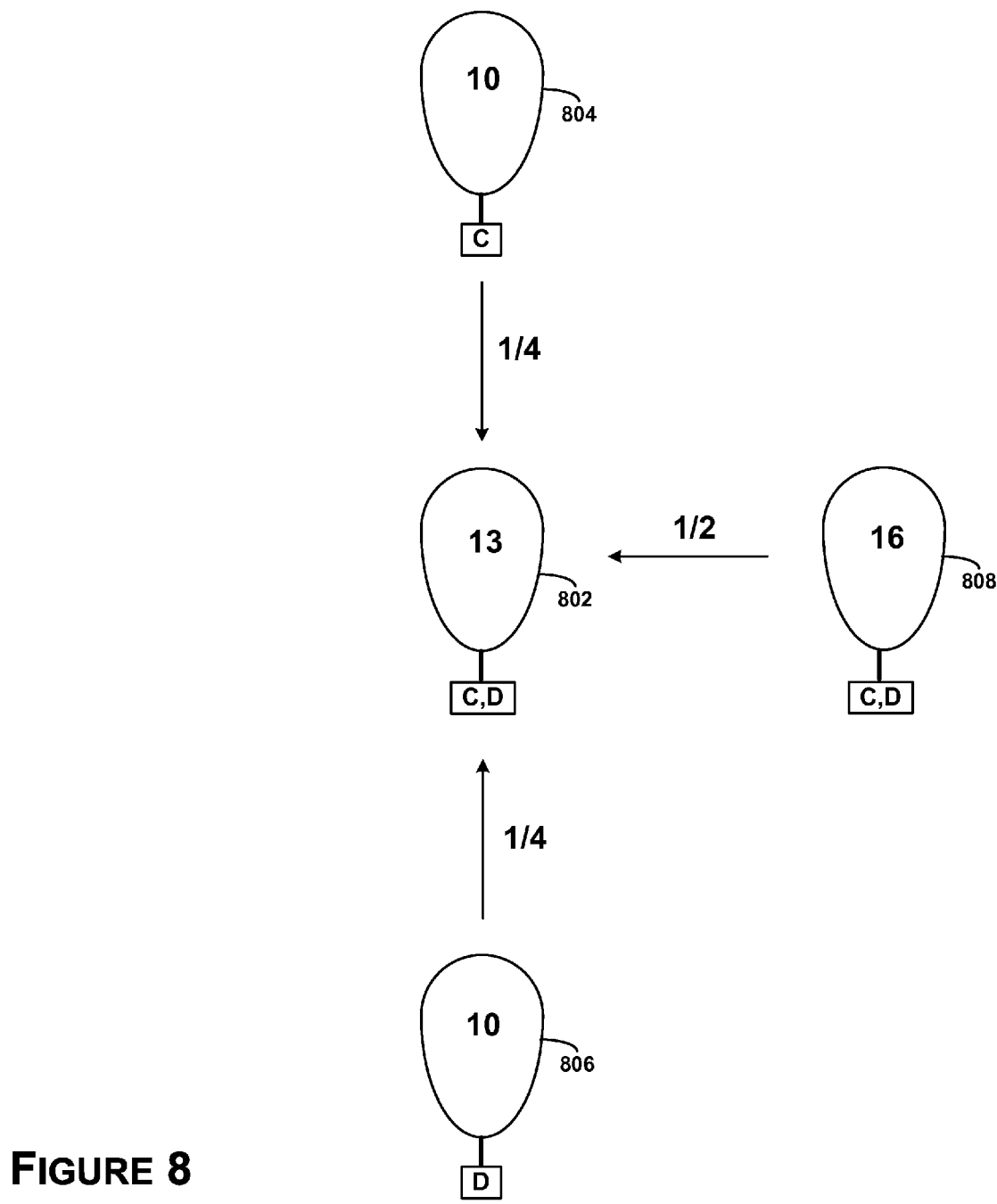
FIG. 8 illustrates the determination of an expected failure mode using weighted averages, according to an example embodiment.

FIG. 8 illustrates the determination of an expected failure mode using weighted averages, according to an example embodiment. In some examples, some cohort balloons of a first balloon may be more similar to the first balloon than other cohort balloons. For instance, some cohort balloons may share more properties with the first balloon than other cohort balloons. If a similarity metric is determined as described above, some cohort balloons may share a higher similarity metric with the first balloon than other cohort balloons.

Accordingly, in some examples, failures of different cohort balloons may be given different weights in determining an expected failure mode. For instance, in a simplified example, a cohort balloon 804 sharing a certain property C with a first balloon 802 may have experienced a failure in ten years. Additionally, a second cohort balloon 806 sharing a different property D with a first balloon 802 may have also experienced a failure in ten years. Furthermore, a third cohort balloon 808 sharing both property C and property D with the first balloon 802 may have experienced a failure in sixteen years.

In this example, it may be determined that the cohort balloon 808 may be more predictive of an expected failure mode than the other two cohort balloons because the cohort balloon 808 shares both property C and property D with the first balloon 802. Accordingly, the cohort balloon 808 may be assigned a greater weight in determining an expected failure mode. For instance, the cohort balloon 808 may be assigned a weight of 0.5 while the cohort balloons 804 and 806 are each assigned a weight of 0.25. Accordingly, an expected failure mode indicating an expected failure in thirteen years may be predicted ($\frac{1}{4}*10+\frac{1}{4}*10+\frac{1}{2}*16$). Other methods of weighting particular cohort balloons (e.g., assigning greater weight to balloons that failed more recently) may be used as well.

Figure 9:
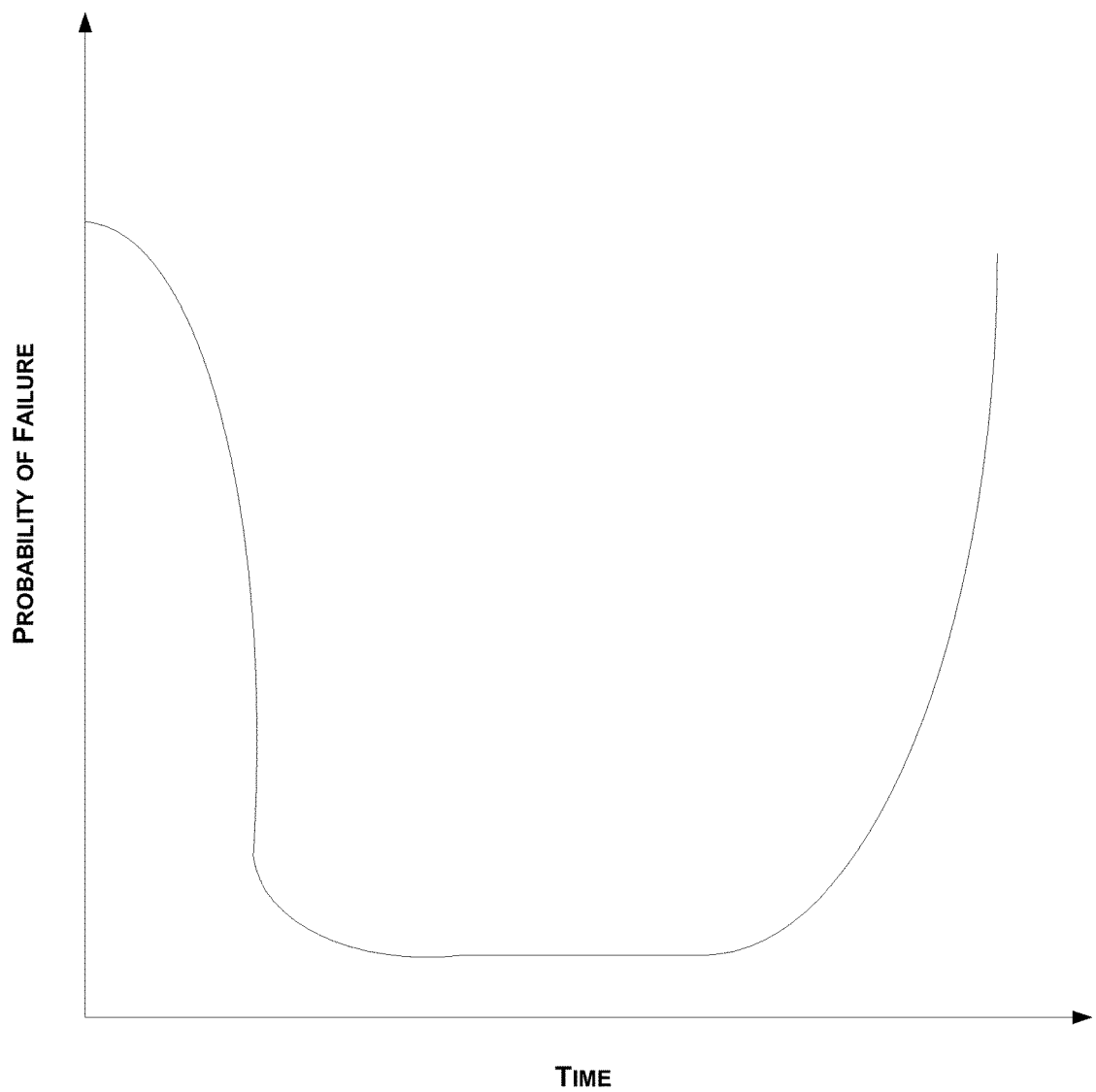
FIG. 9 illustrates a failure rate curve, according to an example embodiment.

In additional examples, an expected failure mode may include a probability distribution of failures, or a failure rate curve, instead of or in addition to averaging together a number of different times-to-failure. FIG. 9 shows a failure rate curve, according to an example embodiment. As shown, a particular balloon component may be likely to fail very early in a balloon's lifetime. However, if the component survives an initial period, the probability of failure may drop to a low level until much later in the balloon's lifetime, when it begins to rise again. Accordingly, an expected failure mode may include probabilities of failures at different times, or other more detailed metrics. Furthermore, a failure rate curve may be determined for individual balloon components, entire balloons, or particular types of failures, for example.

In further examples, the expected failure modes for a cohort may be updated over time. For instance, additional failures of cohort balloons within the network may occur at later points in time. Information about these failures may be recorded and used to refine the expected failure modes of the cohort. In some examples, a computing system may apply a machine-learning process to improve associations between certain balloon properties and expected failure modes. In addition to the general techniques discussed herein, the computing device may apply any of a number of well-known machine learning processes such as an artificial neural network (ANN), SVM (Support Vector Machines), Genetic Algorithms, Bayes Nets, a Reinforcement Learning method, or a Decision Tree, for instance. After performing such a machine-learning process, a computing system may then be able to conclude that certain correlations between balloon properties and expected failure modes are inaccurate or could be more accurate, and then update the expected failure modes accordingly.

As an example, one way that expected failure modes for a cohort may be updated may be to use Bayesian inference. A prior belief about the expected failure modes of a cohort may have been previously determined. New information may be learned as additional cohort balloons within the network experience failures. Accordingly, the expected failure modes for the cohort may then be refined based on the new information in order to determine more accurate predictions of balloon failures.

Additionally, in some examples, regression analysis or other backwards testing may be used to determine which properties of cohort balloons are most predictive of different types of failure modes. Accordingly, the methods of determining expected failure modes may be refined by modifying how cohorts are determined or what weights to give different cohort balloons and/or particular shared balloon properties, for example.

In some example embodiments, method 500 may additionally involve receiving sensor data from at least one sensor located on the first balloon. In some examples, the sensor data may include sensor data from active sensing done on the balloon. For instance, sensors may output data that measures how worn out a certain component or system of a balloon is, how much power a certain component has used, or how deformed a certain balloon material has become. In some examples, the sensor data may be transmitted in real time from sensors on the balloon to computing systems on the balloon and/or to ground-based stations. In other examples, the sensor data may be stored and transmitted in periodic intervals.

For example, sensors may be used to detect strain in a balloon material. In an example embodiment, one or more strain sensors may be embedded in or attached to the envelope of a balloon. Each strain sensor could be positioned at a particular location of the envelope, such that the sensor detects change in the envelope's shape. For instance, strain sensors may be built in to the balloon along the circumference, along the tendons, or over certain patches of the envelope to detect strain in the balloon material. These sensors may be used to detect stretching of a balloon material and/or changes in the size or circumference of the balloon. For example, a strain sensor may measure change in envelope shape by outputting a value that corresponds to horizontal and/or vertical deformation of the envelope. In some cases, the sensor data from the strain sensors may indicate that the balloon has experienced an unusually high amount of strain relative to cohort balloons.

In an additional example, sound echoes and/or harmonics may be used to detect deformity in balloon material. For instance, a certain component of the balloon, such as a ballonet fan, may make an amount of noise that can be measured by one or more sensors. Sound echoes from sound waves bouncing off the balloon material can be measured by the one or more sensors. A change in the sound echoes may indicate that the balloon material has stretched or otherwise been deformed. In some examples, sound waves may be generated by other components in order to detect strain as well.

In additional examples, sensor data may be received that includes information about the experiences of the balloon over time. For example, pressure gauges may be included which may detect the amount of pressure experienced by components of the balloon over time. For instance, pressure gauges may be positioned inside of the balloon envelope in order to detect pressure inside the balloon envelope. The data from the pressure gauges may be used to determine changes in the pressure level experienced by the balloon, the highest pressure level experienced, the average pressure level experienced, and so on.

In further examples, ultraviolet light sensors, photo sensors, and/or temperature sensors may also be included inside or outside of the balloon to measure the balloon's exposure to various environmental conditions over time. Information about environmental conditions may be correlated with the amount of wear and tear experienced by the balloon or individual balloon components. For instance, a particular communication system may be sensitive to low temperatures, the envelope may degrade faster when exposed to regular bright light, and so on.

In yet further examples, altitude sensors and/or GPS sensors may be used to determine the amount of time spent by the balloon at particular altitudes and/or in particular locations. Time spent at particular altitudes and/or in particular locations may increase or decrease the likelihood of failure of certain balloon components or of the entire balloon. Sensor data may be received from other types of sensors as well.

Method 500 may involve determining a predicted failure mode of the first balloon based on the expected failure modes, as shown by block 506. If sensor data from the first balloon is available, the predicted failure mode of the first balloon may be determined based on the expected failure modes in combination with the sensor data. Expected failure modes may first be determined using a predictive model based on cohorts as described above. Then, these expected failure modes may be modified based on sensor data received about the first balloon that directly measures stress or degradation in components of the balloon and/or measures experiences of the balloon over time. A predicted failure mode may indicate a failure that the first balloon is likely to experience. The predicted failure mode may include particular component failures, particular types of failures, and/or particular times-to-failure, among other things.

Figure 10:
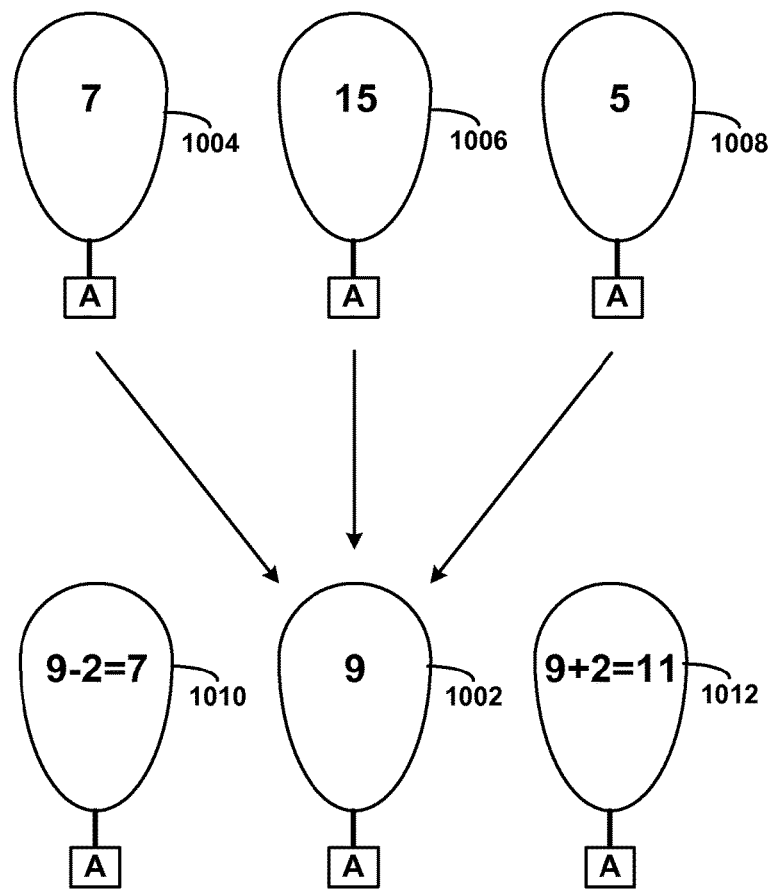
FIG. 10 illustrates the determination of a predicted failure mode of a balloon using cohort balloons combined with sensor data, according to an example embodiment.

FIG. 10 illustrates the determination of a predicted failure mode of a balloon using cohort balloons combined with sensor data, according to an example embodiment. An expected failure mode of a target balloon 1002 may first be determined from failures of cohort balloons as described above. For instance, a first cohort balloon 1004 may experience a failure in a particular component in seven years, a second cohort balloon 1006 may experience a failure in the same component in fifteen years, and a third cohort balloon 1008 may experience a failure in the same component in five years. Accordingly, the target balloon 1002 may be expected to experience a failure in the same component in nine years (the average of seven, fifteen and five).

In some examples, sensor data may indicate that the target balloon 1002 has experienced an unusually high amount of stress in a particular component. For instance, in this example, the cohort balloons may have each experienced failures in the balloon envelopes. Furthermore, sensor data from strain sensors may indicate that the target balloon 1002 may have experienced a disproportionately high amount of stress in the balloon envelope. Or altitude sensors may indicate that the target balloon 1002 has spent a significant amount of time at high altitudes, where the balloon envelope is likely to experience more fatigue. Accordingly, the expected failure mode may be adjusted based on this sensor data to make a prediction about a likely failure of the target balloon 1002. For instance, the expected time to failure of the balloon envelope for the target balloon may be adjusted down from nine years to seven years, as shown in 1010.

In an alternative example, sensor data from strain sensors may indicate that the target balloon 1002 may have experienced a disproportionately low amount of stress in the balloon envelope. Or altitude sensors may indicate that the target balloon 1002 has not spent a significant amount of time at high altitudes, and so on. Accordingly, the expected time-to-failure of the balloon envelope for the target balloon may be adjusted up from nine years to eleven years, as shown in 1012.

Figure 11:
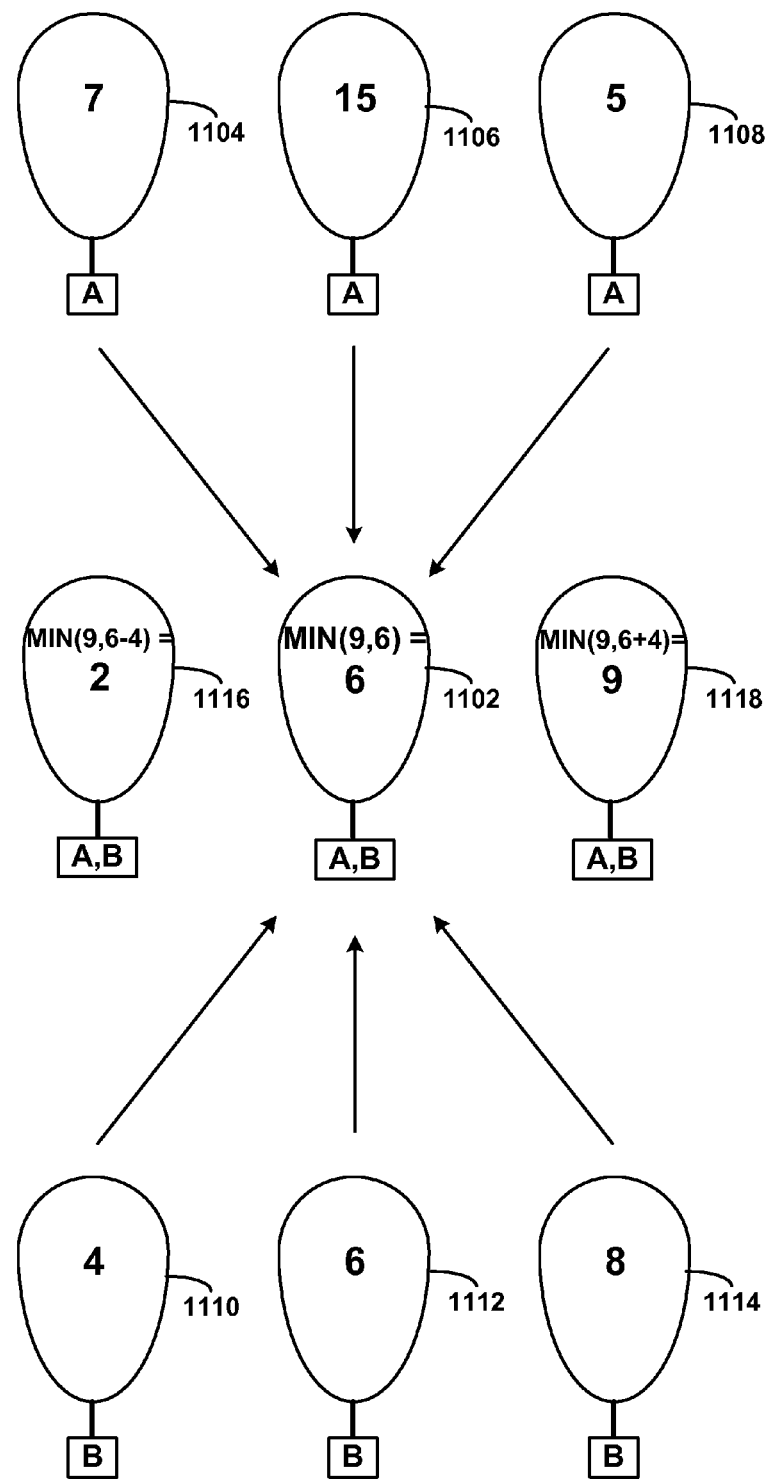
FIG. 11 illustrates the determination of a predicted failure mode of a balloon using cohort balloons with two different failure modes combined with sensor data, according to an example embodiment.

In some examples, sensor data from a particular balloon may be used along with the predictive model based on cohorts in order to determine which type of failure a particular balloon is likely to experience first. FIG. 11 illustrates the determination of a predicted failure mode of a balloon using cohort balloons with two different failure modes combined with sensor data, according to an example embodiment.

In this example, three cohort balloons 1104, 1106, 1108 of a first balloon 1102 may have experienced a failure in a particular component A. The component A may have failed in cohort balloon 1104 in seven years, in cohort balloon 1106 in fifteen years, and in cohort balloon 1108 in five years. Accordingly, an expected failure mode indicating a failure of component A in nine years (the average of seven, fifteen, and five) may be determined.

Furthermore, three additional cohort balloons 1110, 1112, 1114 of a first balloon 1102 may have experienced a failure in a different component B. The component B may have failed in cohort balloon 1110 in four years, in cohort balloon 1112 in six years, and in cohort balloon 1114 in eight years. Accordingly, an expected failure mode indicating a failure of component B in six years (the average of four, six, and eight) may be determined.

In one example, no sensor data may be available which indicates that component A or component B are likely to fail differently in the target balloon 1102 than in the cohort balloons. Accordingly, it may be predicted that the target balloon 1102 is likely to experience a failure in component B at an earlier time than a failure in component A (six years versus nine years).

In an additional example, sensor data may be received which indicates that component B is likely to fail at an earlier point in time in the target balloon 1102 than in the cohort balloons. For instance, the component B in the target balloon 1102 may have experienced a disproportionate amount of stress, and the expected time-to-failure of component B may be adjusted down from six years to two years. Accordingly, it may be predicted that the target balloon 1102 is likely to experience a failure in component B at an earlier time than a failure in component A (two years versus nine years), as shown by 1116.

In a further example, sensor data may be received which indicates that component B is likely to fail at a later point in time in the target balloon 1102 than in the cohort balloons. For instance, the component B in the target balloon 1102 may have experienced less stress than usual, and the expected time-to-failure of component B may be adjusted up from six years to ten years. Accordingly, it may now be predicted that the target balloon 1102 is likely to experience a failure in component A at an earlier time than a failure in component B (nine years versus ten years), as shown by 1118. As demonstrated, the sensor data may therefore be used to adjust predictions based on cohort balloons in order to determine a component that is likely to fail first in a particular balloon.

It should be understood that none of the simplified examples given here are meant to be limiting. In practice, many different groups of cohorts and types of sensors may be used to predict a wide variety of types of possible failures. The sensor data may be used to refine predictions based on cohort balloons in a variety of ways. The methods described herein may easily be adapted to determine predicted failure modes for individual balloons within an extended network of balloons.

Method 500 may involve causing the first balloon to operate within the network based on the predicted failure mode, as shown by block 508. For example, individual balloons may be given particular tasks and/or assigned to particular locations within the network based on how and/or when the balloons are likely to experience failures. In some examples, a control system may compile predicted failure modes of some or all of the balloons within the network in order to assign tasks and locations to each balloon.

For instance, it may be determined that an individual balloon is likely to experience an imminent total failure, such as a rip in the balloon envelope. Accordingly, the balloon may be moved to an area where it can easily be recovered. For example, the balloon may be rerouted to avoid bodies of water or countries where balloon recovery may be difficult. Further, the balloon may be repositioned to avoid landing on populated locations or to avoid crossing commercial flight lanes. The balloon may also be moved to a location close to a ground station so that data can be quickly offloaded from the failing balloon, and so on.

In a further example, a predicted failure mode may indicate that a particular component of the balloon may no longer be usable. For instance, one of the balloon's communication systems may be expected to fail in the near future. In some examples, the balloon may lose its ability to communicate with ground-based stations. In that case, the balloon may be reassigned to serve as a relay communicator between individual balloons. In some examples, the balloon may lose its ability to communicate with both ground-based stations and other balloons. In that case, the balloon may be reassigned to function as a weather balloon, and so on.

Many other examples of using the predicted failure modes of individual balloons within the network exist as well. In some cases, if a particular balloon is expected to fail in a particular way, it may be re-tasked in order to try to prevent the failure or prolong the time-to-failure. For instance, if a particular balloon contains a particular component that has often failed in cohort balloons, the balloon may be given tasks that avoid using that component to prevent the component from failing. Thus, the balloon network can take advantage of the predicted failure modes of individual balloons in order to efficiently assign tasks and locations to the individual balloons within the network.

IV. Conclusion

Further, the above detailed description describes various features and functions of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the ladder diagrams, scenarios, and flow charts in the figures and as discussed herein, each block and/or communication may represent a processing of information and/or a transmission of information in accordance with example embodiments. Alternative embodiments are included within the scope of these example embodiments. In these alternative embodiments, for example, functions described as blocks, transmissions, communications, requests, responses, and/or messages may be executed out of order from that shown or discussed, including substantially concurrent or in reverse order, depending on the functionality involved. Further, more or fewer blocks and/or functions may be used with any of the ladder diagrams, scenarios, and flow charts discussed herein, and these ladder diagrams, scenarios, and flow charts may be combined with one another, in part or in whole.

A block that represents a processing of information may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical functions or actions in the method or technique. The program code and/or related data may be stored on any type of computer readable medium such as a storage device including a disk or hard drive or other storage medium.

The computer readable medium may also include non-transitory computer readable media such as computer-readable media that stores data for short periods of time like register memory, processor cache, and random access memory (RAM). The computer readable media may also include non-transitory computer readable media that stores program code and/or data for longer periods of time, such as secondary or persistent long term storage, like read only memory (ROM), optical or magnetic disks, compact-disc read only memory (CD-ROM), for example. The computer readable media may also be any other volatile or non-volatile storage systems. A computer readable medium may be considered a computer readable storage medium, for example, or a tangible storage device.

Moreover, a block that represents one or more information transmissions may correspond to information transmissions between software and/or hardware modules in the same physical device. However, other information transmissions may be between software modules and/or hardware modules in different physical devices.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

What is claimed is:

1. A computer-implemented method comprising:
   determining a similarity metric between a first balloon and each of a plurality of balloons operating as part of a balloon network, wherein the similarity metric between the first balloon and a particular balloon of the plurality of balloons indicates an amount of similarity between the first balloon and the particular balloon based on one or more shared properties between the first balloon and the particular balloon;
   identifying, based on the similarity metric between the first balloon and each of the plurality of balloons, at least one cohort balloon from the plurality of balloons operating as part of the balloon network;
   identifying at least one failure of the at least one cohort balloon;
   determining a predicted failure mode of the first balloon based on the at least one identified failure of the at least one cohort balloon; and causing the first balloon to operate within the balloon network based on the predicted failure mode of the first balloon.

2. The method of claim 1, further comprising:
   receiving sensor data from at least one sensor located on the first balloon; and
   wherein the predicted failure mode of the first balloon is determined based at least in part on the sensor data.

3. The method of claim 1, wherein determining the predicted failure mode of the first balloon comprises determining a weighted average of a plurality of failures of the at least one cohort balloon.

4. The method of claim 1, wherein determining the predicted failure mode of the first balloon comprises determining a probability distribution over time of a plurality of failures of the at least one cohort balloon.

5. The method of claim 1, wherein determining the predicted failure mode of the first balloon comprises determining a failure mode from a plurality of failure modes that is expected to occur at an earliest point in time.

6. The method of claim 1, further comprising periodically updating the predicted failure mode of the first balloon based at least in part on at least one additional failure of the at least one cohort balloon.

7. The method of claim 1, wherein at least one property shared by one or more of the cohort balloons and the first balloon comprises a specific balloon model.

8. The method of claim 1, wherein at least one property shared by one or more of the cohort balloons and the first balloon comprises a manufacturer.

9. The method of claim 1, wherein at least one property shared by one or more of the cohort balloons and the first balloon comprises a material used in the construction of the first balloon.

10. The method of claim 1, wherein at least one property shared by one or more of the cohort balloons and the first balloon comprises a supplier.

11. The method of claim 1, wherein at least one property shared by one or more of the cohort balloons and the first balloon comprises a production batch.

12. The method of claim 1, wherein the predicted failure mode of the first balloon comprises a failure in a balloon material.

13. The method of claim 1, wherein the predicted failure mode of the first balloon comprises a failure in a communication system of the first balloon.

14. The method of claim 1, wherein the predicted failure mode comprises a failure in a power system of the first balloon.

15. The method of claim 2, wherein the at least one sensor comprises at least one strain sensor.

16. The method of claim 2, wherein the at least one sensor comprises at least one pressure gauge.

17. The method of claim 2, wherein the at least one sensor comprises at least one temperature sensor.

18. The method of claim 2, wherein the at least one sensor comprises at least one light sensor.

19. The method of claim 2, wherein the at least one sensor comprises at least one altitude sensor.

20. The method of claim 2, wherein the at least one sensor comprises at least one acoustic resonance sensor.

21. A non-transitory computer readable storage medium having stored therein instructions, that when executed by a computing device, cause the computing device to perform functions comprising:
   determining a similarity metric between a first balloon and each of a plurality of balloons operating as part of a balloon network, wherein the similarity metric between the first balloon and a particular balloon of the plurality of balloons indicates an amount of similarity between the first balloon and the particular balloon based on one or more shared properties between the first balloon and the particular balloon;

identifying, based on the similarity metric between the first balloon and each of the plurality of balloons, at least one cohort balloon from the plurality of balloons operating as part of the balloon network;

identifying at least one failure of the at least one cohort balloon;

determining a predicted failure mode of the first balloon based on the at least one identified failure of the at least one cohort balloon; and causing the first balloon to operate within the balloon network based on the predicted failure mode of the first balloon.

22. The non-transitory computer readable storage medium of claim 21, further comprising instructions, that when executed by the computing device, cause the computing device to perform a function comprising receiving sensor data from at least one sensor located on the first balloon; and wherein the predicted failure mode of the first balloon is determined based at least in part on the sensor data.

23. The non-transitory computer readable storage medium of claim 21, wherein determining the predicted failure mode of the first balloon comprises determining a weighted average of a plurality of failures of a plurality of cohort balloons.

24. A system, comprising: at least one processor; and data storage comprising program instructions executable by the at least one processor to cause the at least one processor to perform functions comprising:

determining a similarity metric between a first balloon and each of a plurality of balloons operating as part of a balloon network, wherein the similarity metric between the first balloon and a particular balloon of the plurality of balloons indicates an amount of similarity between the first balloon and the particular balloon based on one or more shared properties between the first balloon and the particular balloon;

identifying, based on the similarity metric between the first balloon and each of the plurality of balloons, at least one cohort balloon from the plurality of balloons operating as part of the balloon network;

identifying at least one failure of the at least one cohort balloon;

determining a predicted failure mode of the first balloon based on the at least one identified failure of the at least one cohort balloon; and causing the first balloon to operate within the balloon network based on the predicted failure mode of the first balloon.

25. The system of claim 24, wherein the data storage further comprises program instructions executable by the at least one processor to cause the at least one processor to perform a function comprising:

receiving sensor data from at least one sensor located on the first balloon; and wherein the predicted failure mode of the first balloon is determined based at least in part on the sensor data.

26. The system of claim 24, wherein determining the failure mode of the first balloon comprises determining a weighted average of a plurality of failures of a plurality of cohort balloons.

27. The method of claim 1, further comprising:

comparing the similarity metric between the first balloon and each of the plurality of balloons to a threshold;

identifying at least one balloon of the plurality of balloons for which the similarity metric between the first balloon and the at least one identified balloon is above the threshold; and determining the at least one cohort balloon to be the at least one identified balloon of the plurality of balloons for which the similarity metric is above the threshold.

28. The method of claim 1, further comprising:

identifying a number of shared properties between the first balloon and each of the plurality of balloons; and determining the at least one cohort balloon to be at least one balloon of the plurality of balloons for which the identified number of shared properties between the first balloon and the at least one balloon is above a threshold number of shared properties.

29. The method of claim 1, further comprising:

identifying, based on the similarity metric between the first balloon and each of the plurality of balloons, a certain number of nearest neighbour balloons from the plurality of balloons, wherein the nearest neighbour balloons are the certain number of most similar balloons to the first balloon out of the plurality of balloons; and determining the at least one cohort balloon to be the nearest neighbour balloons.

* * * * *